(12) United States Patent
Sonoda et al.

(10) Patent No.: US 9,055,653 B2
(45) Date of Patent: Jun. 9, 2015

(54) DEPOSITION APPARATUS AND DEPOSITION METHOD

(75) Inventors: Tohru Sonoda, Osaka (JP); Nobuhiro Hayashi, Osaka (JP); Shinichi Kawato, Osaka (JP); Satoshi Inoue, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 276 days.

(21) Appl. No.: 13/637,627

(22) PCT Filed: Feb. 10, 2011

(86) PCT No.: PCT/JP2011/000764
§ 371 (c)(1),
(2), (4) Date: Sep. 26, 2012

(87) PCT Pub. No.: WO2011/129043
PCT Pub. Date: Oct. 20, 2011

(65) Prior Publication Data
US 2013/0017320 A1      Jan. 17, 2013

(30) Foreign Application Priority Data

Apr. 12, 2010   (JP) .................................. 2010-091481

(51) Int. Cl.
| | | |
|---|---|---|
| C23C 14/24 | (2006.01) | |
| C23C 14/04 | (2006.01) | |
| H05B 33/10 | (2006.01) | |
| C23C 14/12 | (2006.01) | |

(Continued)

(52) U.S. Cl.
CPC .............. *H05B 33/10* (2013.01); *C23C 14/042* (2013.01); *C23C 14/044* (2013.01); *C23C 14/12* (2013.01); *C23C 14/225* (2013.01); *C23C 14/24* (2013.01); *H01L 27/3211* (2013.01); *H01L 51/56* (2013.01); *H01L 51/0011* (2013.01)

(58) Field of Classification Search
None
See application file for complete search history.

(56) References Cited

U.S. PATENT DOCUMENTS

| | | | | |
|---|---|---|---|---|
| 3,241,519 | A | * | 3/1966 | Lloyd ........................... 118/720 |
| 4,526,132 | A | * | 7/1985 | Ohta ............................. 118/719 |

(Continued)

FOREIGN PATENT DOCUMENTS

| | | |
|---|---|---|
| CN | 1522098 A | 8/2004 |
| JP | 10-102237 A | 4/1998 |

(Continued)

OTHER PUBLICATIONS

Japanese Unpublished Patent Application No. 2009-213570, filed on Sep. 15, 2009, Sonoda et al., titled "Vapor Deposition Method and Vapor Deposition Apparatus", 61 pages (Corresponds to WO 2011/034011 A1 ).

(Continued)

*Primary Examiner* — Charles Capozzi
(74) *Attorney, Agent, or Firm* — Morrison & Foerster LLP

(57) ABSTRACT

A deposition apparatus 50 forms a thin film 3 in a predetermined pattern on a substrate 10 for an organic EL display. A first correction plate 81 and a second correction plate 82 are placed between a shadow mask 60 and a deposition source 53 that emits deposition particles. Each of the correction plates 81, 82 has a plurality of blade plates 83 and a frame 84 that supports the plurality of blade plates 83. The blade plates 83 are placed so as to be tilted with respect to the shadow mask 60, and to extend parallel to each other with an opening 86 between adjoining ones of the blade plates 83 as viewed in a direction perpendicular the deposition mask 60.

14 Claims, 14 Drawing Sheets

(51) Int. Cl.
*C23C 14/22* (2006.01)
*H01L 27/32* (2006.01)
*H01L 51/56* (2006.01)
*H01L 51/00* (2006.01)

(56) References Cited

U.S. PATENT DOCUMENTS

| | | | | |
|---|---|---|---|---|
| 5,584,973 | A * | 12/1996 | Wada et al. | 204/192.12 |
| 6,006,694 | A * | 12/1999 | DeOrnellas et al. | |
| 2004/0142108 | A1 | 7/2004 | Atobe et al. | |
| 2010/0272921 | A1 * | 10/2010 | Vanden Brande | 427/561 |

FOREIGN PATENT DOCUMENTS

| | | | |
|---|---|---|---|
| JP | 2003-73823 A | 3/2003 | |
| JP | 2004-43839 A | 2/2004 | |
| JP | 2004-169066 A | 6/2004 | |
| JP | 2010-174305 A | 8/2010 | |
| WO | WO 2009083546 A1 * | 7/2009 | C23C 14/16 |
| WO | 2011/034011 A1 | 3/2011 | |

OTHER PUBLICATIONS

International Search Report received for PCT Patent Application No. PCT/JP2011/000764, mailed on Mar. 15, 2011, 3 pages (1 page of English Translation and 2 pages of PCT Search Report).

* cited by examiner

DEPOSITION APPARATUS AND DEPOSITION METHOD

CROSS REFERENCE TO RELATED APPLICATIONS

This is a U.S. National Phase patent application of PCT/JP2011/000764, filed Feb. 10, 2011, which claims priority to Japanese Patent Application No. 2010-091481, filed Apr. 12, 2010, each of which is hereby incorporated by reference in the present disclosure in its entirety.

TECHNICAL FIELD

The present invention relates to deposition apparatuses and deposition methods that are preferably used for, e.g., large-sized organic electroluminescence (EL) displays etc.

BACKGROUND ART

In recent years, larger-sized, higher image quality, and lower power consumption flat panel displays have been required, and high image quality organic EL displays capable of being driven at a low voltage have received considerable attention. The organic EL displays have the following structure. For example, in full color active matrix organic EL displays, thin film-like organic EL elements are provided on a substrate having thin film transistors (TFTs) thereon. In the organic EL element, organic EL layers including red (R), green (G), and blue (B) light-emitting layers are stacked between a pair of electrodes, and each light-emitting layer emits light in response to a voltage applied between the electrodes. This light is used to display an image.

In manufacture of such organic EL displays, thin films such as light-emitting layers and electrodes are patterned by using a technique such as a vacuum deposition method, an ink jet method, or a laser transfer method. For example, in low molecular organic EL displays (organic light-emitting diodes (OLED)), the vacuum deposition method is mainly used to pattern the light-emitting layers.

In the vacuum deposition method, a mask having a predetermined opening patterned therethrough is normally fixed to a substrate in close contact therewith, and is placed in a vacuum chamber so that the mask side of the substrate faces a deposition source. Then, a film-forming material is deposited from the deposition source to a desired position on the substrate through the opening of the mask. A thin film such as the light-emitting layers is patterned in this manner. The light-emitting layer of each color is separately deposited color by color (separate deposition). In particular, a mass production process uses a mask (a full contact shadow mask) having the same size as the substrate, and the substrate having the mask in close contact therewith is typically fixed at a predetermined position with respect to the deposition source when performing deposition.

A vacuum deposition method is also known in which deposition is performed while relatively moving a substrate etc. with respect to a deposition source (Patent Document 1). In Patent Document 1, a mask is used in which a plurality of small holes or long slit holes having a smaller area than an electrode to be formed are formed at predetermined intervals. Deposition is performed while moving the mask in a direction crossing the direction in which the small holes etc. are arranged, whereby the electrode having a predetermined pattern is formed.

Regarding the present invention, a technique is disclosed in which spreading of an scattered evaporation material is reduced by desirably designing the hole shape of an evaporation source (a deposition source) (Patent Document 2). In Patent Document 2, holes through which the evaporation material is emitted toward a substrate have a circular shape as viewed from above, and have a tapered cross section so that the diameter increases toward the outlet of the hole. This allows the film-thickness distribution of the evaporation material to be concentrated in the regions immediately above the holes, and allows the material to be efficiently deposited on the substrate.

CITATION LIST

Patent Document

PATENT DOCUMENT 1: Japanese Patent Publication No. H10-102237
PATENT DOCUMENT 2: Japanese Patent Publication No. 2004-169066

SUMMARY OF THE INVENTION

Technical Problem

In the case of patterning light-emitting layers etc. by a vacuum deposition method in a conventional mass production process, the mask size increases as the substrate size increases. As the substrate size increases, a gap tends to be produced between the substrate and the mask due to bending or extension of the mask caused by its own weight. Accordingly, it is difficult to perform accurate patterning on large substrates, and thus to implement higher definition due to displacement of the deposition position or color mixture.

As the substrate size increases, the size of the mask, a frame holding the mask, etc. becomes enormous, and the weight thereof increases accordingly. Thus, it is difficult to handle them, which may adversely affect productivity and safety. Associated apparatuses are also increased in size and become complicated, whereby it is difficult to design the apparatuses, and installation cost becomes very high.

Accordingly, it is difficult to apply the conventional vacuum deposition method to large substrates, and no method has been implemented which allows patterning to be performed on large substrates of, e.g., more than 60 inches by mass production.

The inventor has proposed a deposition method that can be applied to such large substrates (hereinafter also referred to as the "new deposition method") (Japanese Patent Application No. 2009-213570).

Specifically, this deposition method uses a mask unit that is formed by integrating a deposition source and a shadow mask having a smaller area than a substrate. With the shadow mask and the substrate being held with a constant gap therebetween, deposition is performed while relatively scanning the mask unit with respect to the substrate. This avoids the above problems associated with the increased substrate size, and allows patterning to be performed on large substrates by deposition in a mass production process.

However, the amount of undesirable deposition in a patterned thin film tends to be increased in the new deposition method.

FIG. 1 is a schematic view showing a deposition process in the new deposition method. In the figure, the reference character "101" represents a substrate, "102" represents a deposition mask, "102a" represents an opening, "103" represents a deposition source, "103a" represents an emission port through which deposition particles are emitted, and "110"

represents a thin film such as a light-emitting layer formed on the substrate. The deposition mask 102 and the deposition source 103 are used as a unit, and are held in a fixed relative positional relation. An arrow represents a relative scanning direction of the deposition mask 102 etc. with respect to the substrate 101.

In the new deposition method, deposition is performed with a constant gap between the deposition mask 102 and the substrate 101. Accordingly, as shown in FIG. 2, some of the deposition particles that obliquely pass through the opening 102a of the deposition mask 102 are deposited on a portion outside a deposition region r1 (a region facing the opening 102a of the deposition mask 102), causing undesirable deposition in a direction perpendicular to the scanning direction. The light-emitting layer etc. functions as a light-emitting region of a pixel. Thus, color mixture and degradation in characteristics are caused if such undesirable deposition extends to a light-emitting region of an adjoining pixel. Accordingly, it is preferable to reduce undesirable deposition as much as possible. As used herein, the term "undesirable deposition" refers to the thin film 110 that is formed outside the deposition region r1, as shown in FIG. 2.

Undesirable deposition can be reduced by reducing the gap between the deposition mask 102 and the substrate 101. For example, as shown in FIG. 3, since the deposition particles fly with directionality, the width of undesirable deposition ("B" in FIG. 3) is represented by "P×tan γ," where "γ" represents a maximum value of an angle (an incident angle) at which the deposition particles are directed to the substrate 101 with respect to an axis perpendicular to the substrate 101, the deposition mask 102, and the deposition source 103 (this axis is also referred to as a deposition axis L1) as viewed in the scanning direction, and "P" represents a distance between the deposition mask 102 and the substrate 101 in the vertical direction.

Thus, undesirable deposition increases as the gap between the deposition mask 102 and the substrate 101 increases. Undesirable deposition decreases as the gap between the deposition mask 102 and the substrate 101 decreases. Accordingly, it is preferable to place the deposition mask 102 and the substrate 101 as close to each other as possible. In this case, however, it is required to place the deposition mask 102 and the substrate 101 at the smallest possible distance of, e.g., several tens of micrometers etc. and to perform scanning without allowing the deposition mask 102 and the substrate 101 to contact each other. It is difficult to stably perform such precise control of the deposition mask 102 and the substrate 101. In particular, in the case of large substrates 101, it is difficult to perform such precise control in practical applications.

Another method to reduce undesirable deposition is to reduce the incident angle γ. The incident angle γ is limited by either the emission angle ψ at which the deposition particles are emitted through the emission port 103a or the passing angle δ at which the deposition particles pass through the opening 102a (both the emission angle ψ and the passing angle δ are angles with respect to the deposition axis L1). Although the passing angle δ and the emission angle ψ are shown to be almost the same in a schematic diagram of FIG. 3, the opening 102a has a very small width, and thus the passing angle δ is normally smaller than the emission angle ψ. Accordingly, the incident angle γ is typically limited by the passing angle δ.

As shown in FIG. 4, the maximum value of the passing angle δ is affected by the cross-sectional aspect ratio of the opening 102a of the deposition mask 102. The cross-sectional aspect ratio is a value determined by the width, depth, cross-sectional shape, etc. of the opening 102a. The cross-sectional aspect ratio is herein represented by the ratio (f/h) of the depth dimension "f" to the width dimension "h" in a cross section of the opening 102a extending perpendicularly to the mask surface as viewed in the scanning direction. In this case, as shown in FIG. 4, the maximum value of the passing angle δ is smaller in the deposition mask 102 having a high cross-sectional aspect ratio (f2/h) shown by two-dot chain line than in the deposition mask 102 having a low cross-sectional aspect ratio (f1/h) shown by solid line.

Accordingly, increasing the cross-sectional aspect ratio of the opening 102a of the deposition mask 102 is one effective method to reduce undesirable deposition. Possible methods to implement a high cross-sectional aspect ratio include accurately forming the cross-sectional shape of the opening 102a, increasing the thickness of the deposition mask 102, etc. However, none of these methods can be easily implemented.

For example, the cross-sectional shape of the opening 102a can be accurately formed by using an electroforming method, a drilling method with laser cutting, etc. However, it is difficult to accurately process the cross-sectional shape of the opening on the order of micrometers, if the depth of the opening is larger than the width thereof, such as in the case where the depth of the opening is three times or more as large as the width thereof.

Increasing the thickness of the deposition mask 102 increases the weight of the deposition mask 102 itself, and thus tends to cause bending of the deposition mask 102 due to its own weight. Such bending of the deposition mask 102 makes it difficult to stably maintain a constant gap between the deposition mask 102 and the substrate 101. As the size of the deposition mask 102 increases, it becomes more difficult to handle the deposition mask 102 and to control the deposition mask 102 in a deposition apparatus.

Moreover, as the thickness of the deposition mask 102 increases, the deposition particles are more likely to be deposited on the inner surface of the opening 102a. This tends to reduce the opening size of the opening 102a, which may result in clogging. Accordingly, increasing the thickness of the deposition mask 102 is also disadvantageous in that replacement of the deposition mask 102 is frequently required, etc.

The incident angle γ can be reduced by making the emission angle ψ of the deposition particles smaller than the passing angle δ thereof. However, the maximum emission angle ψ of the deposition particles is typically larger than the passing angle δ thereof, as described above.

That is, although it depends on the type and structure of the deposition source, the deposition particles are normally emitted so as to spread outward from a position immediately above the emission port 103, namely from the direction of the deposition axis L1 corresponding to the emission angle ψ of 0°, and the flying deposition particles are stochastically distributed. The distribution of the deposition particles is the highest at the position immediately above the emission port 103a, and decreases as the emission angle ψ increases. However, the maximum emission angle ψ is so large that a shield is provided around the deposition mask 102.

On the other hand, the deposition source of Patent Document 2 provides steep film-thickness distribution of the evaporation material, and allows the deposition particles to be concentrated in the center of the emission direction. Accordingly, using this deposition source can increase the amount of deposition particles whose emission angle ψ is smaller than their passing angle δ. However, this method merely improves distribution characteristics of the deposition particles, and there still remain a large amount of deposition particles whose emission angle ψ is larger than their passing angle δ. Thus, this method is not effective in reducing undesirable deposition.

It is an object of the present invention to provide a deposition apparatus etc. that is capable of effectively reducing undesirable deposition by a practical method and capable of implementing manufacturing of high quality, high definition, large-sized organic EL displays in a mass production process.

Solution to the Problem

In order to achieve the above object, according to the present invention, deposition correction members having a predetermined structure are provided between a deposition source and a deposition mask, so that an emission angle of deposition particles can be substantially limited to a small value.

Specifically, a deposition apparatus of the present invention is a deposition apparatus that forms a thin film in a predetermined pattern on a substrate, including: a deposition mask; a deposition source that has an emission port on a side of the deposition mask, and that emits, through the emission port, deposition particles forming the thin film; and two or more deposition correction members placed between the deposition mask and the deposition source. Each of the deposition correction members has a plurality of blade plates placed so as to extend substantially parallel to the deposition mask, and a frame that supports the plurality of blade plates. The blade plates are placed so as to be tilted with respect to the deposition mask, and to extend parallel to each other with an opening between adjoining ones of the blade plates as viewed in a direction perpendicular the deposition mask.

That is, the at least two deposition correction members are placed between the deposition source and the deposition mask, and each of the deposition correction members is provided with the plurality of blade plates arranged in a lateral direction so as to extend substantially parallel to the deposition mask. The blade plates are tilted with respect to the deposition mask, and adjoin each other with a constant opening (also referred to as the "inter-blade-plate opening") therebetween as viewed in the direction perpendicular to the deposition mask.

Thus, by adjusting setting of each deposition correction member, such as the tilt of the blade plates, the width of the inter-blade-plate openings, and arrangement of each deposition correction member, some of the deposition particles traveling from the deposition source toward the deposition mask can be blocked by each deposition correction member, and only the deposition particles traveling in a desired direction are allowed to pass therethrough. As a result, the emission angle of the deposition particles reaching the deposition mask can be adjusted to a predetermined range, whereby undesired deposition can be reduced.

The deposition particles (deposition material) blocked by the deposition correction members adhere to and are deposited on the deposition correction members. However, since the blade plates are tilted with respect to the deposition mask, the gap between adjoining ones of the blade plates can be increased while reducing the inter-blade-plate opening. This can effectively suppress reduction in the opening size of the inter-blade-plate opening due to the deposition of the deposition material, whereby the deposition process can be continuously performed for a long time.

More specifically, it is preferable that the deposition apparatus further include: a mask unit including the deposition mask, the deposition source, and the deposition correction members, and maintains a fixed relative positional relation among the deposition mask, the deposition source, and the deposition correction members; a substrate support apparatus that supports the substrate; and a moving apparatus that relatively moves at least one of the mask unit and the substrate along a predetermined scanning direction with a constant gap being provided between the substrate and the deposition mask. The deposition mask has a plurality of openings having a stripe pattern, and is placed so that a direction in which the openings extend matches the scanning direction. Each of the deposition correction members is placed so that a direction in which the blade plates extend matches the scanning direction. The blade plates in each of the deposition correction members are tilted at a same angle as viewed in the scanning direction.

This configuration allows the thin film such as a light-emitting layer having a stripe pattern to be stably formed with a reduced width of undesirable deposition, regardless of the substrate size. Accordingly, manufacturing of high-definition, high-quality, large-sized organic EL displays can be implemented in a mass production process.

In this case, it is preferable that the deposition correction members include two deposition correction members, and the blade plates in one of the two deposition correction members be tilted in a direction opposite to that in which the blade plates in the other deposition correction member are tilted.

This configuration allows undesirable deposition on both sides of the thin film having the stripe pattern to be effectively reduced. Moreover, the widths of undesirable deposition on both sides of the thin film can be separately adjusted by tilting the blade plates to different degrees.

The deposition apparatus may further include a reversing apparatus that reverses at least one of the deposition correction members.

Reversing the deposition correction member allows the other surface of the blade plate to be used if the blade plate has a large amount of deposition particles deposited on its one surface. This can reduce the frequency of replacement of the deposition correction member by half.

It is preferable that the deposition apparatus further include a slide apparatus that slidingly displaces at least one of the deposition correction members in the direction perpendicular to the deposition mask.

This configuration allows the arrangement of the deposition correction member to be automatically adjusted by using the slide apparatus. Thus, accurate positioning of the deposition correction member can be easily and rapidly implemented. This configuration also allows the deposition correction member to be reversed without being detached from the mask unit.

At least one of the deposition correction members may be provided so as to be tiltable as viewed in the scanning direction, and the deposition apparatus may further include a control apparatus that controls a tilt of the tiltable deposition correction member.

Tilting the deposition correction member itself allows, e.g., the tilt of the blade plates with respect to the deposition mask to be finely adjusted while performing the deposition process. Thus, more practical, accurate reduction in undesirable deposition can be achieved.

The blade plates in at least one of the deposition correction members may be rotatably supported by the frame, and the deposition apparatus may further include: a rotating apparatus that rotationally displaces the rotatable blade plates; and a control apparatus that operates with the rotating apparatus to adjust a tilt of the rotatable blade plates.

This configuration allows the tilt angle of the blade plates to be adjusted as desired by cooperation between the rotating apparatus and the control apparatus. Thus, the tilt angle of the blade plates can be adjusted according to the situation during the deposition process, and setting of the tilt angle of the blade plates can be changed according to the substrate to be processed. This is advantageous in terms of versatility. The direction in which the blade plates are tilted can be reversed by rotating the blade plates. Thus, the frequency of replacement of the deposition correction member can be reduced by half, even if the reversing apparatus is not provided.

It is preferable that at least one of the deposition correction members be provided detachably.

This configuration allows the deposition material deposited on the deposition correction member to be periodically collected. For example, the deposition material can be collected by heating. However, since the deposition mask may be distorted by heating, the deposition material adhering to the deposition mask cannot be collected by heating. Since the deposition correction member can be heated, the deposition material deposited thereon can be easily collected. This can ensure high utilization efficiency of the material.

A deposition method according to the present invention is a deposition method for forming a thin film in a stripe pattern on the substrate by depositing, through a plurality of openings formed in a deposition mask, deposition particles emitted from a deposition source. This deposition method includes: placing between the deposition source and the deposition mask at least two deposition correction members, which allow only the deposition particles traveling in different predetermined directions to pass therethrough, and performing deposition while limiting a traveling direction of the deposition particles by the deposition correction members.

According to this deposition method, of the deposition particles traveling from the deposition source toward the deposition mask, the deposition particles traveling in the predetermined different directions are limited in terms of the traveling direction before they reach the deposition mask. Since only the deposition particles having a predetermined traveling direction are allowed to reach the deposition mask, the emission angle can be substantially reduced, and undesirable deposition can be reduced.

Specifically, the deposition method may further include: an alignment step of, with the substrate being supported by the substrate support apparatus and with the gap being provided between the substrate and the deposition mask, aligning the mask unit and the substrate so that the mask unit faces the substrate; and a deposition step of forming the thin film by sequentially depositing the deposition particles while relatively moving at least one of the mask unit and the substrate along the predetermined scanning direction by the moving apparatus.

This allows deposition with reduced undesirable deposition can be implemented regardless of the substrate size, by merely performing a predetermined operation. Thus, this method is preferable for a mass production process of large-sized organic EL displays.

In particular, in the case where the deposition correction member is detachably provided, it is preferable that the deposition method further include a collection step of detaching the deposition correction member from the deposition apparatus, and collecting the deposition particles adhering to the deposition correction member.

This can ensure high utilization efficiency of the material.

Advantages of the Invention

As described above, according to the present invention, undesirable deposition can be effectively reduced by a practical method, whereby high quality, high definition, large-sized organic EL displays can be manufactured in a mass production process as well.

DESCRIPTION OF EMBODIMENTS

An embodiment of the present invention will be described in detail below with reference to the accompanying drawings. The following description is essentially by way of example only, and is not intended to limit the present invention, its applications, or its uses.

(Organic EL Display)

The present embodiment is described with respect to an example in which the present invention is applied to manufacture of organic EL displays. An organic EL display of the present embodiment is an active matrix display that implements full color image display by controlling light emission of a plurality of pixels (sub-pixels 2R, 2G, 2B) of red (R), green (G), and blue (B) (also collectively referred to as "RGB").

Figure 1:
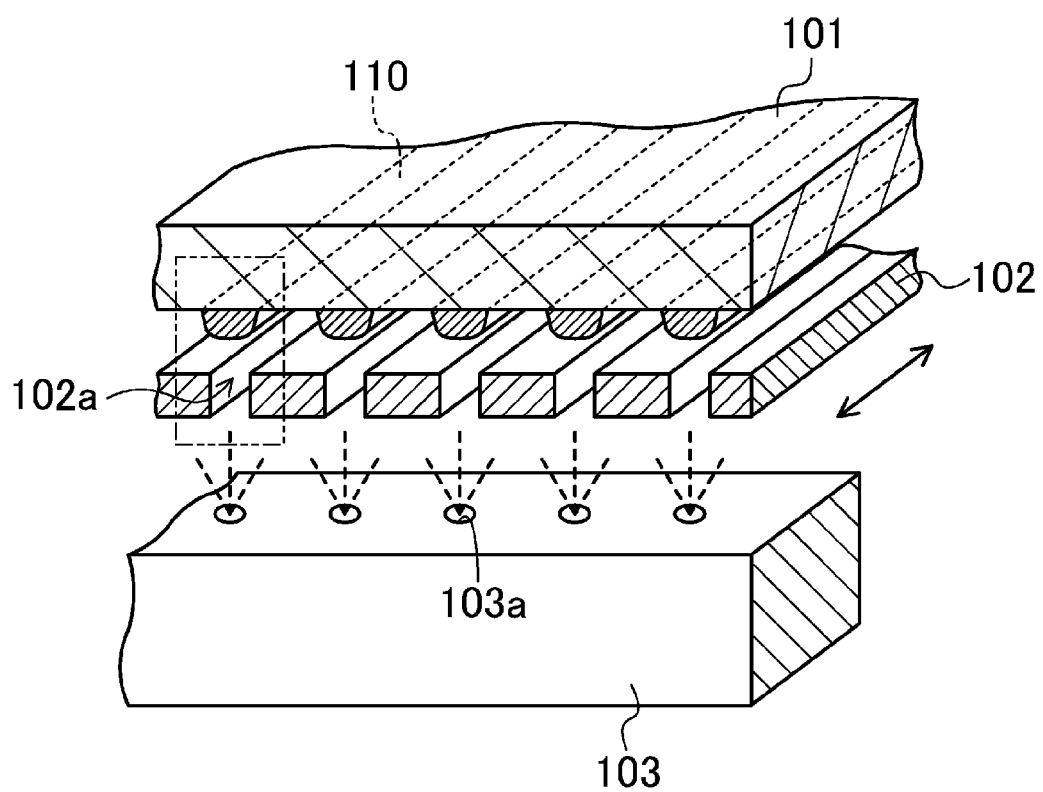
FIG. 1 is a schematic diagram showing an example of a deposition process in a new deposition method.
Figure 2:
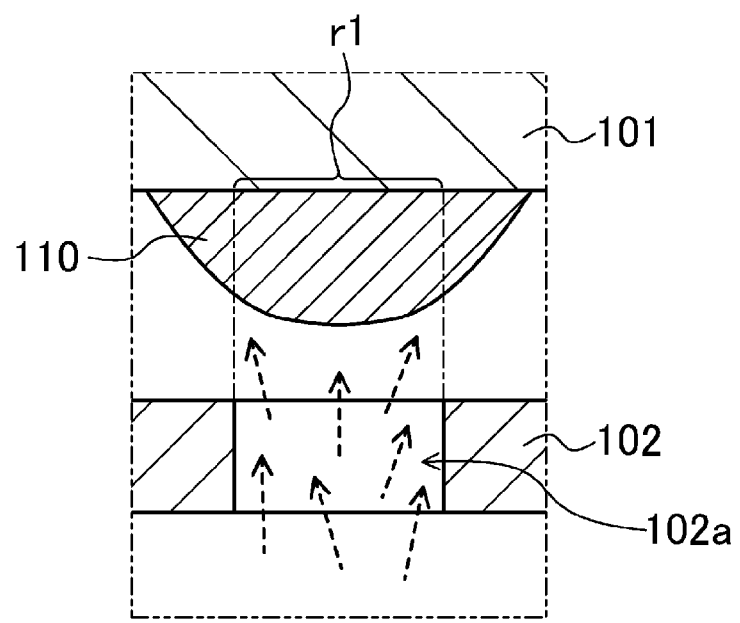
FIG. 2 is an enlarged schematic diagram of a portion shown by two-dot chain line in FIG. 1.
Figure 3:
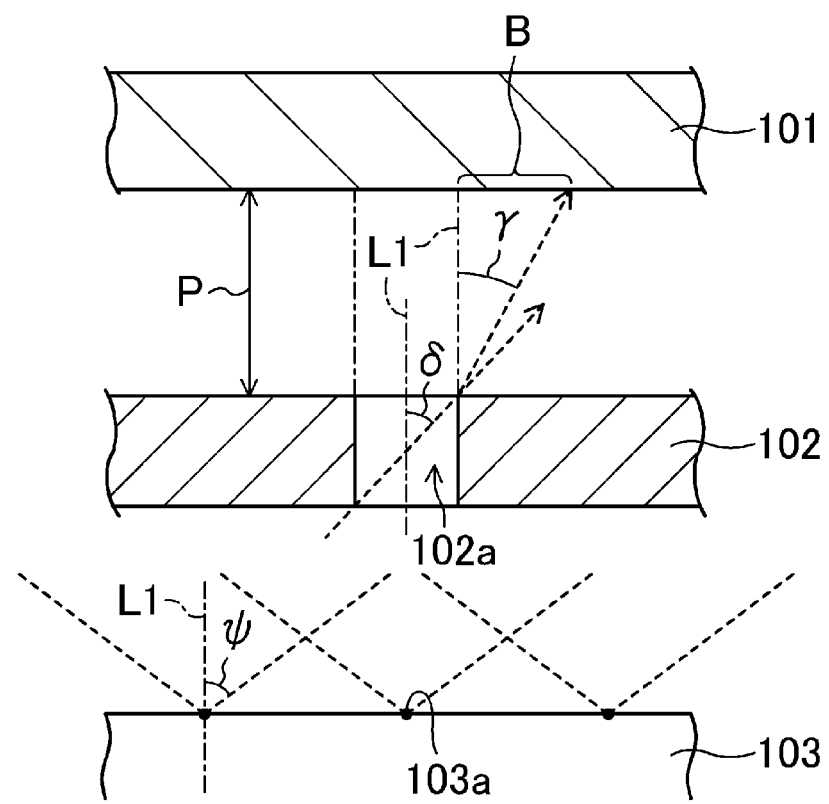
FIG. 3 is a diagram showing the relation between a configuration of a deposition mask etc. and undesirable deposition.
Figure 4:
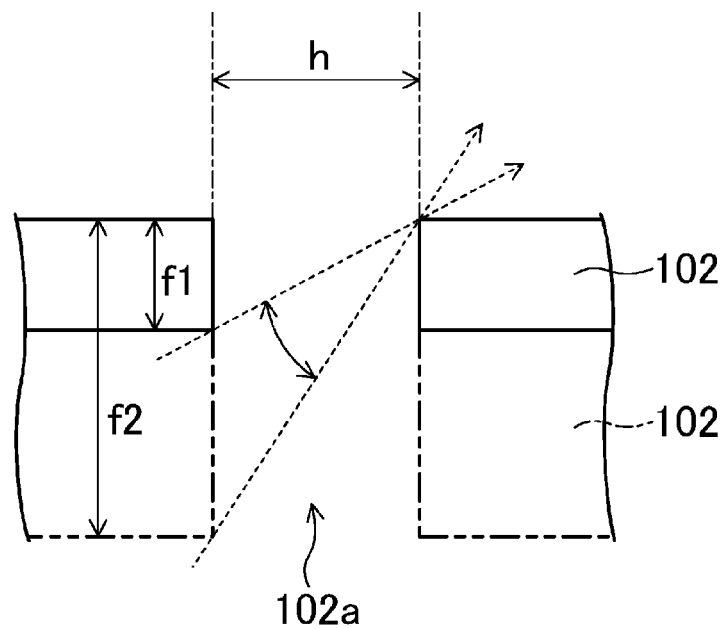
FIG. 4 is a diagram showing the relation between a cross-sectional aspect ratio of an opening in the deposition mask and a passing angle.
Figure 5:
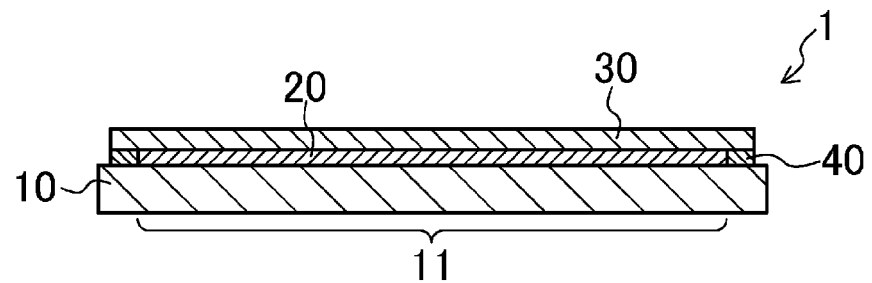
FIG. 5 is a schematic cross-sectional view showing an organic EL display in a first embodiment.

As shown in FIG. 5, an organic EL display 1 of the present embodiment is formed by a substrate 10, a thin film-like organic EL element 20, a sealing plate 30, etc. The substrate 10 and the sealing plate 30 are in the shape of a rectangular plate, and the organic EL element 20 is inserted therebetween and is enclosed and hermetically sealed by a sealing member 40 such as an adhesive. A central portion of the surface of the substrate 10 serves as a display region 11 that provides image display, and the organic EL element 20 is placed in the display region 11.

Figure 6:
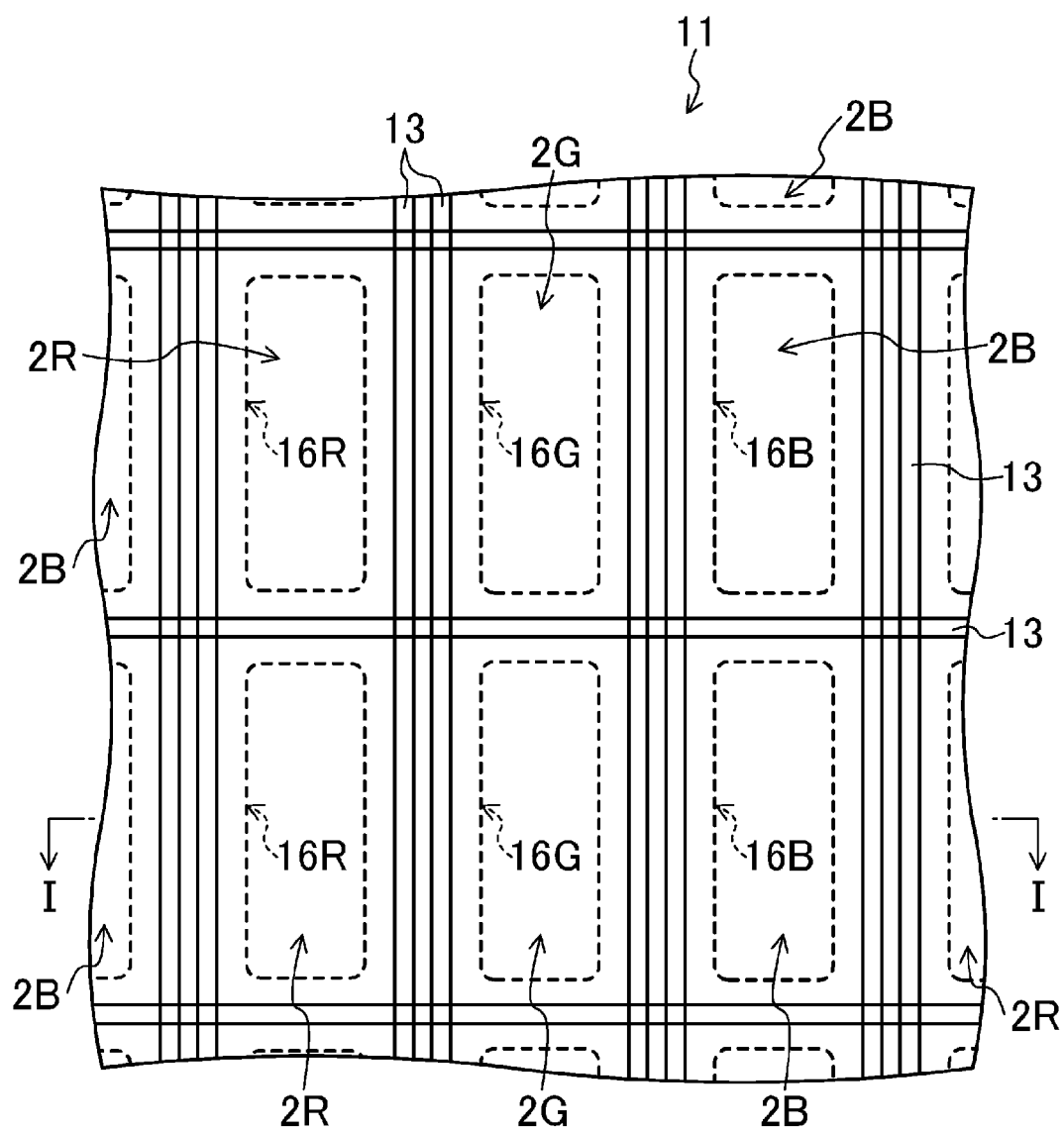
FIG. 6 is a schematic plan view showing a main part of a substrate.
Figure 7:
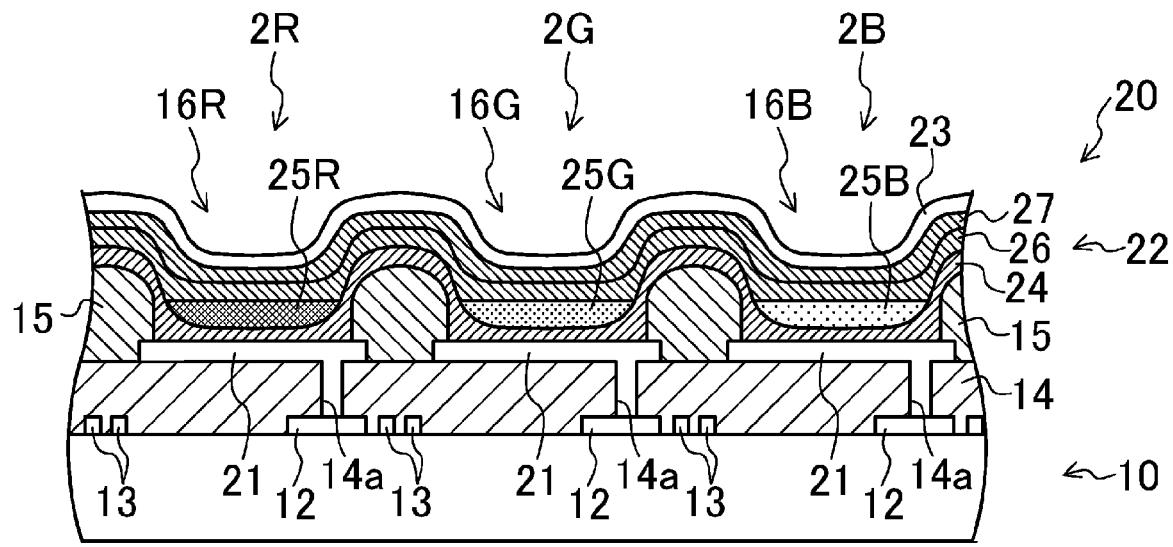
FIG. 7 is a schematic diagram showing a cross section taken along line I-I in FIG. 6.

As shown in FIGS. 6 and 7, thin film transistors (TFTs) 12, interconnects 13, an interlayer film 14, etc. are provided in the display region 11 of the substrate 10.

A glass plate etc. is used as the substrate 10. The substrate 10 is preferably transparent because the organic EL display 1 of the present embodiment is of a bottom emission type in which emitted light is output from the side of the substrate 10. However, the substrate 10 need not necessarily be transparent if the organic EL display 1 is of a top emission type. The interconnects 13 are patterned on the substrate 10, and are comprised of a plurality of gate lines extending parallel to each other, a plurality of signal lines crossing the gate lines and extending parallel to each other, etc. RGB sub-pixels 2R, 2G, 2B are arranged in a plurality of regions each surrounded by the interconnects 13 and forming a grid pattern. The TFTs 12 that control light emission are respectively provided in the sub-pixels 2R, 2G, 2B.

The RGB sub-pixels 2R, 2G, 2B are arranged so that the sub-pixels of the same color are arranged in line in a row direction and the RGB sub-pixels are arranged in a repeated pattern of RGB in a column direction. Each set of three RGB sub-pixels 2R, 2G, 2B that are successively arranged in the column direction form one pixel. As described in detail below, light-emitting layers 25R, 25G, 25B of the sub-pixels 2R, 2G, 2B are respectively formed by thin films 3 that are formed for each color so as to have a stripe pattern.

The interlayer film 14 is an insulating thin film of an acrylic resin etc., which functions also as a planarizing film. The interlayer film 14 is stacked over the entire display region 11 so as to cover the TFTs 12 etc. If the organic EL display 1 is of a bottom emission type, the interlayer film 14 is preferably transparent.

The organic EL element 20 is formed by first electrodes 21 (anodes), an organic EL layer 22, a second electrode 23 (a cathode), etc. The first electrodes 21 are comprised of, e.g., indium tin oxide (ITO) etc. An ITO film etc. is stacked on the interlayer film 14, and is patterned into the plurality of first electrodes 21 in a grid pattern corresponding to the sub-pixels 2R, 2G, 2B. The first electrodes 21 are respectively connected to the TFTs 12 via contact holes 14a. An insulating edge cover 15 is stacked on the first electrodes 21. The edge cover 15 has light-emitting regions 16R, 16G, 16B formed as rectangular openings so as to correspond to the sub-pixels 2R, 2G, 2B, respectively. A large part of the first electrode 21 is exposed from the light-emitting region 16R, 16G, 16B, and the ends of the first electrode 21 are covered by the edge cover 15. Light emission of each pixel is output through these light-emitting regions 16R, 16G, 16B. This stacked structure may be inverted so that the first electrode 21 serves as a cathode and the second electrode 23 serves as an anode. In this case, the stacking order of the layers interposed between the first and second electrode 21, 23 is also reversed.

The organic EL layer 22 is provided between the first electrodes 21 and the second electrode 23. In the organic EL layer 22 of the present embodiment, a hole transport layer 24, the light-emitting layers 25R, 25G, 25B, an electron transport layer 26, and an electron injection layer 27 are sequentially stacked over the first electrodes 21. The hole transport layer 24 of the present embodiment also functions as a hole injection layer. The configuration of the organic EL layer 22 shown in the present embodiment is merely an example and is not limited to this, and the organic EL layer 22 may be formed by selecting and combining the layers as necessary. For example, a hole injection layer may be provided in addition to the hole transport layer 24, and a blocking layer may further be provided. The organic EL layer 22 need only include at least the light-emitting layers 25R, 25G, 25B. Known materials can be used as the materials of the hole transport layer 24, the light-emitting layers 25R, 25G, 25B, etc.

The hole transport layer 24, the electron transport layer 26, and the electron injection layer 27 are stacked over the entire display region 11. As described above, the light-emitting layers 25R, 25G, 25B have a stripe pattern corresponding to the sub-pixels 2R, 2G, 2B of each color. The second electrode 23 is stacked over the entire display region 11 so as to cover the organic EL layer 22.

(Basic Manufacturing Method of Organic EL Display 1)

Figure 8:
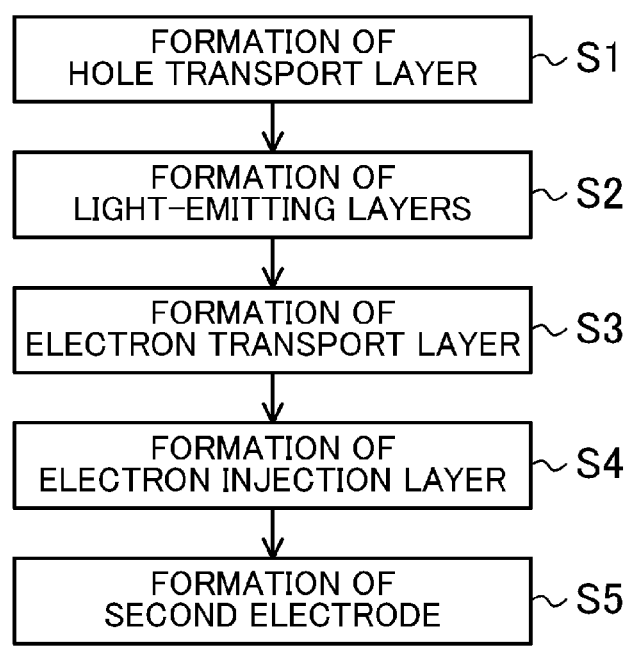
FIG. 8 is a flowchart showing a basic manufacturing process of the organic EL display.

A basic manufacturing method of the above organic EL display 1 will be described with reference to FIG. 8. FIG. 8 shows the step of forming the hole transport layer 24 etc. in the organic EL element 20 among the steps of the manufacturing method of the organic EL display 1.

First, the substrate 10 is prepared which has formed thereon the TFTs 12, the first electrodes 21, etc. (this substrate is also referred to as the "TFT substrate 10"). For example, a 500×400 mm rectangular glass plate having a thickness of about 1 mm can be used as a base of the TFT substrate 10. In this case, the interlayer film 14 can be formed with a thickness of about 2 μm, the first electrodes 21 can be formed with a thickness of about 100 nm, and the edge cover 15 can be formed with a thickness of about 1 μm. Since the TFT substrate 10 can be formed by a known method, description thereof is omitted.

The hole transport layer 24 is formed over the prepared TFT substrate 10 so as to cover the TFTs 12 etc. (step S1). Specifically, the material of the hole transport layer 24 is deposited over the entire display region 11. For example, a mask for the entire region, which has an opening of the same size as the display region 11, is bonded to the TFT substrate 10 so as to be in close contact therewith. The material of the hole transport layer 24 is deposited while rotating the TFT substrate 10 having the mask thereon. For example, the hole transport layer 24 can be formed with a thickness of about 30 nm by using α-NPD. A conventional deposition apparatus can be used for this deposition process.

Next, the light-emitting layers 25R, 25G, 25B are stacked on the hole transport layer 24 (step S2). The light-emitting layers 25R, 25G, 25B are separately deposited color by color (separate deposition). The light-emitting layers 25R, 25G, 25B are typically deposited by co-deposition using a host material and a dopant material. Materials selected from known materials can be used as the materials of the light-emitting layers 25R, 25G, 25B, such as the host material and the dopant material. The light-emitting layers 25R, 25G, 25B can be formed with a thickness in the range of, e.g., 10-100 nm. In the present embodiment, the new deposition method and a deposition apparatus for the new deposition method are used in this step, and will be described in detail later.

Then, the electron transport layer 26 is stacked on the light-emitting layers 25R, 25G, 25B (step S3). Specifically, the material of the electron transport layer 26 is deposited over the entire display region 11 by the same method as that used for the hole transport layer 24. Moreover, the electron injection layer 27 is stacked on the electron transport layer 26 (step S4). The electron injection layer 27 is also formed by depositing the material of the electron injection layer 27 over the entire display region 11 by the same method as that used for the hole transport layer 24.

Materials selected from known materials can be used as the materials of the electron transport layer 26 and the electron injection layer 27. Both the electron transport layer 26 and the electron injection layer 27 may be integrally formed by using the same material. Each of the electron transport layer 26 and the electron injection layer 27 may be formed with a thickness in the range of, e.g., 10-100 nm. For example, the electron transport layer 26 may be formed with a thickness of 30 nm by using Alq, and the electron injection layer 27 may be formed with a thickness of 1 nm by using LiF.

Then, the second electrode 23 is stacked on the electron injection layer 27 (step S5). The second electrode 23 is also formed by depositing the material of the second electrode 23 over the entire display region 11 by the same method as that used for the hole transport layer 24. A material selected from known materials can be used as the material of the second electrode 23. For example, the second electrode 23 may be formed with a thickness of 50 nm by using aluminum (Al).

Lastly, the TFT substrate 10 having the organic EL element 20 thus formed thereon is bonded to the sealing plate 30 to hermetically seal the organic EL element 20. Thus, a main part of the organic EL display 1 is completed.

(Separate Deposition)

The step of forming the light-emitting layers 25R, 25G, 25B by separate deposition (step S2) will be described below. The new deposition method described above and the deposition apparatus for the new deposition method are used in this step. In particular, since the deposition apparatus of the present embodiment is designed to achieve reduction in undesirable deposition, the basic structure of the deposition apparatus will first be described, and then the structure of a main part of the deposition apparatus which allows undesirable deposition to be reduced will be described in detail.

(Basic Structure of Deposition Apparatus)

Figure 9:
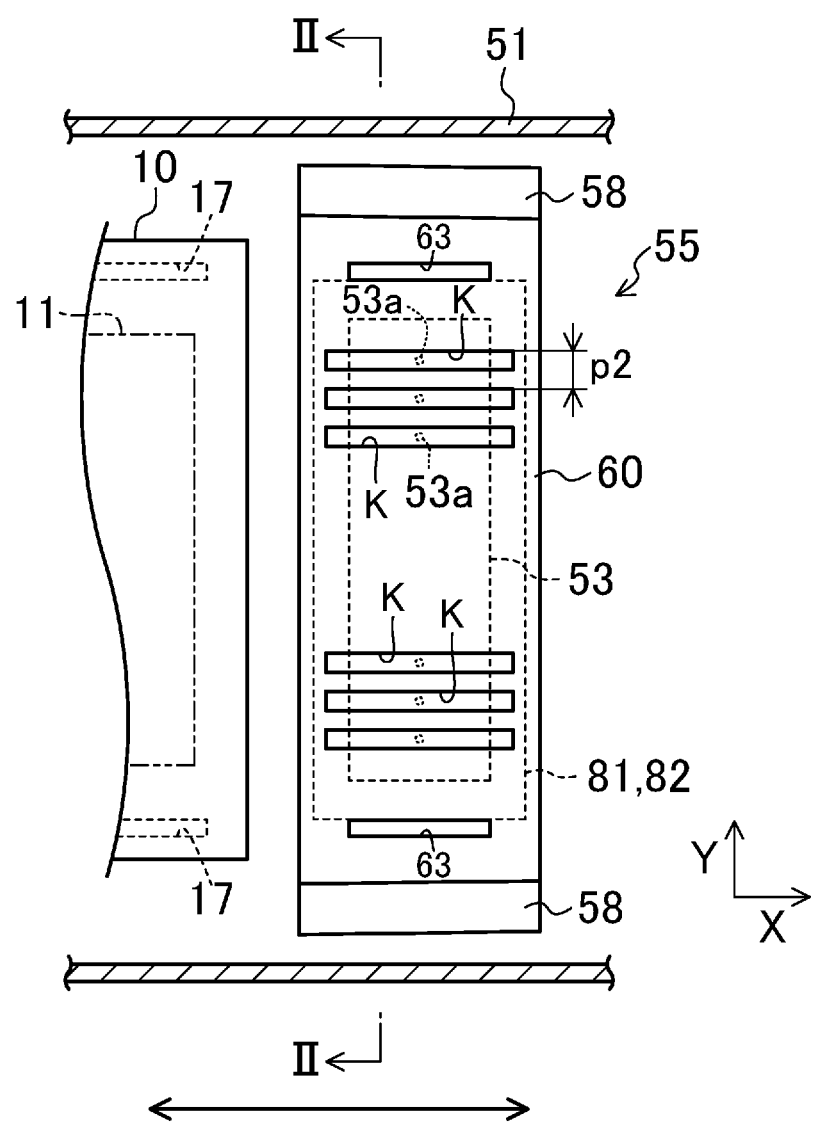
FIG. 9 is a schematic plan view showing a main part of a deposition apparatus.
Figure 10:
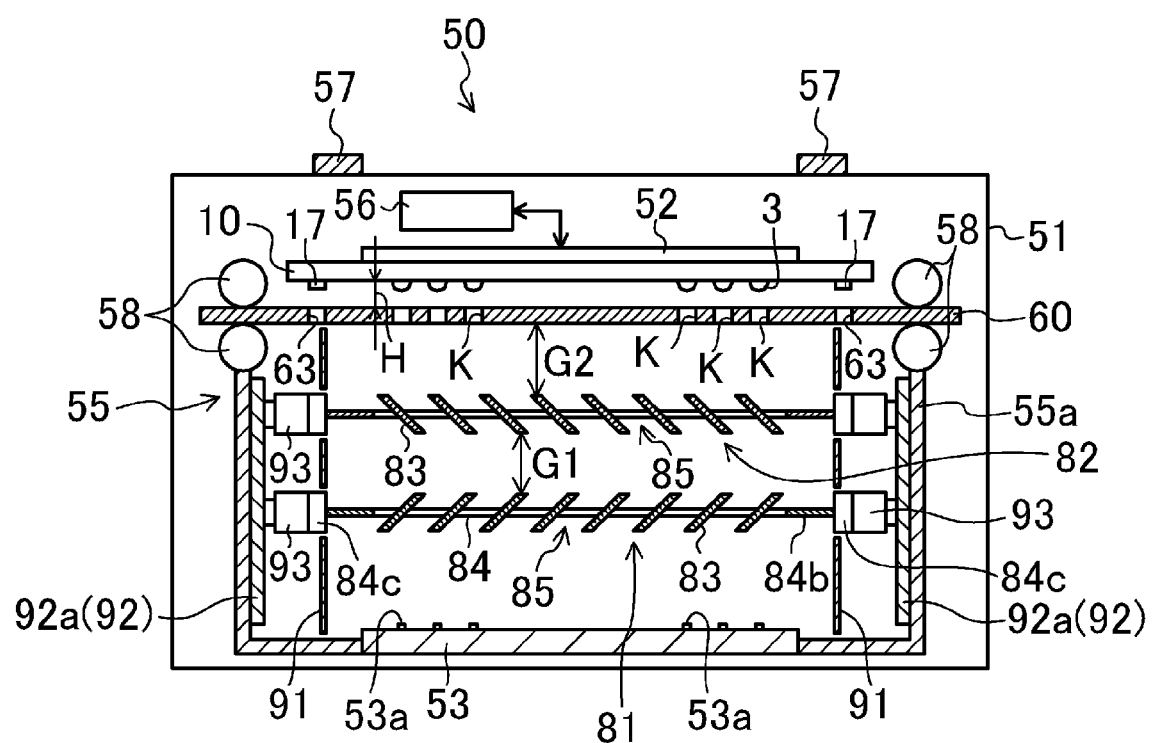
FIG. 10 is a schematic diagram showing a cross section taken along line II-II in FIG. 9.

FIGS. 9 and 10 show a deposition apparatus 50 of the present embodiment. As shown in these figures, the deposition apparatus 50 includes a vacuum chamber 51, a substrate support apparatus 52, a deposition source 53, a shadow mask 60 (a deposition mask), a mask unit 55, a moving apparatus 56, etc. The deposition apparatus 50 of the present embodiment is of a type in which deposition particles are emitted upward.

The vacuum chamber 51 is a box-shaped airtight container that can be opened and closed. The inside of the vacuum chamber 51 can be decompressed and held in a predetermined low pressure state by a decompression apparatus located outside the figure.

The substrate support apparatus 52 has a function to horizontally support the substrate 10 to be processed (also referred to as the "target substrate 10") so that the row direction (the direction in which the sub-pixels 2R, 2G, 2B of each color are arranged in line) extends in the direction shown by arrow in FIG. 9 (the scanning direction). For example, if the substrate support apparatus 52 is provided with an electrostatic chuck, the target substrate 10 can be held by the electrostatic chuck, and thus can be supported without being bent by its own weight.

The substrate support apparatus 52 is capable of moving horizontally, and the horizontal movement of the substrate support apparatus 52 in the scanning direction is automatically controlled by the moving apparatus 56. For convenience, the scanning direction is also referred to as the "X-axis direction," and the direction perpendicular to the scanning direction is also referred to as the "Y-axis direction." The X-axis and Y-axis directions are shown as appropriate in the figures. The direction in which the deposition axis perpendicular to the target substrate 10 etc. extends (the vertical direction) is also referred to as the "Z-axis direction."

The shadow mask 60 is horizontally placed below the target substrate 10 supported by the substrate support apparatus 52, with a constant gap H between the shadow mask 60 and the target substrate 10. The vertical distance (the shortest distance) of the gap H is preferably in the range of 50 μm to 1 mm. The smaller the vertical distance of the gap H is, the more preferable in order to prevent undesirable deposition. However, if the vertical distance of the gap H is less than 50 μm, the target substrate 10 may contact the shadow mask 60. If the vertical distance of the gap H exceeds 1 mm, deposition becomes unstable, which may cause color mixture or reduction in patterning accuracy.

The shadow mask 60 is in the shape of a rectangular plate, and has a plurality of openings K, K, . . . . The plurality of openings K, K, . . . are formed in a stripe pattern so that the openings K, K, . . . are arranged in line in the direction along the longer side of the shadow mask 60 and so that each opening K extends along the shorter side of the shadow mask 60 (only some of the openings are shown in the figures). For example, the plurality of openings K, K, . . . are formed so as to correspond to the rows of the sub-pixels 2R, 2G, 2B of each color. Each opening K is formed in the form of a long slit extending through the shadow mask 60.

The dimension of the longer side of the shadow mask 60 is larger than the dimension in the Y-axis direction of the display region 11 of the target substrate 10 that faces the shadow mask 60. The dimension of the shorter side of the shadow mask 60 is smaller than the dimension in the X-axis direction of the display region 11 of the target substrate 10 that faces the shadow mask 60. The plurality of openings K, K, . . . are provided in the range corresponding to the display region 11 in the Y-axis direction (an effective region).

A second marker 63 is provided on both sides of the effective region for alignment with a first marker 17 provided on the target substrate 10. The first marker 17 and the second marker 63 are detected by a sensor 57 provided in the deposition apparatus 50, and the target substrate 10 and the shadow mask 60 are accurately positioned in the horizontal direction based on the detection value (these markers and the sensor are also referred to as the "positioning mechanism"). The shadow mask 60 is detachably mounted in the mask unit 55 so that the direction in which the openings K, K, . . . extend matches the X-axis direction.

The mask unit 55 is provided with a holder 55a, a tension retaining apparatus 58, the deposition source 53, a first correction plate 81 (a deposition correction member), a second correction plate 82 (a deposition correction member), an adhesion preventing plate 91, etc. When mounted in the mask unit 55, the shadow mask 60 is pulled and horizontally supported under tension by the tension retaining apparatus 58. Thus, the shadow mask 60 is held in a fixed relative positional relation with the deposition source 53 etc. by the holder 55a.

The deposition source 53 is provided so as to extend along the Y-axis direction. The deposition source 53 is placed below the shadow mask 60 so as to face the target substrate 10 with the shadow mask 60 interposed therebetween. A plurality of emission ports 53a, 53a, . . . , through which the deposition particles are emitted toward the target substrate 10, are provided in the upper surface of the deposition source 53 so as to be arranged in line in the Y-axis direction (only some of the emission ports are shown in the figures).

In the present embodiment, these emission ports 53a, 53a, . . . are positioned so as to face the openings K of the shadow mask 60, respectively, and each emission port 53a is located in the center (the center in both X-axis and Y-axis directions) of a corresponding one of the openings K as viewed in plan. The deposition apparatus 50 is provided with a shutter (not shown) that opens and closes the space between the deposition source 53 and the shadow masks 60. By controlling opening and closing of the shutter, the deposition apparatus 50 is automatically controlled so that deposition can be performed at appropriate timing.

(Structure of Main Part of Deposition Apparatus)

The first correction plate 81 and the second correction plate 82, which plays an important role in reducing undesirable deposition, are also placed between the shadow mask 60 and the deposition source 53 (the first correction plate 81 and the second correction plate 82 are sometimes simply referred to as the "correction plates 81, 82" when it is not necessary to distinguish the first correction plate 81 and the second correction plate 82 from each other). The first correction plate 81 is located on the side of the deposition source 53, and the second correction plate 82 is located on the side of the shadow mask 60. Each correction plate 81, 82 is placed substantially parallel to the shadow mask 60, and is separated from each of the shadow mask 60, the deposition source 53, and the other correction plate by a predetermined interval in the Z-axis direction.

Figure 11:
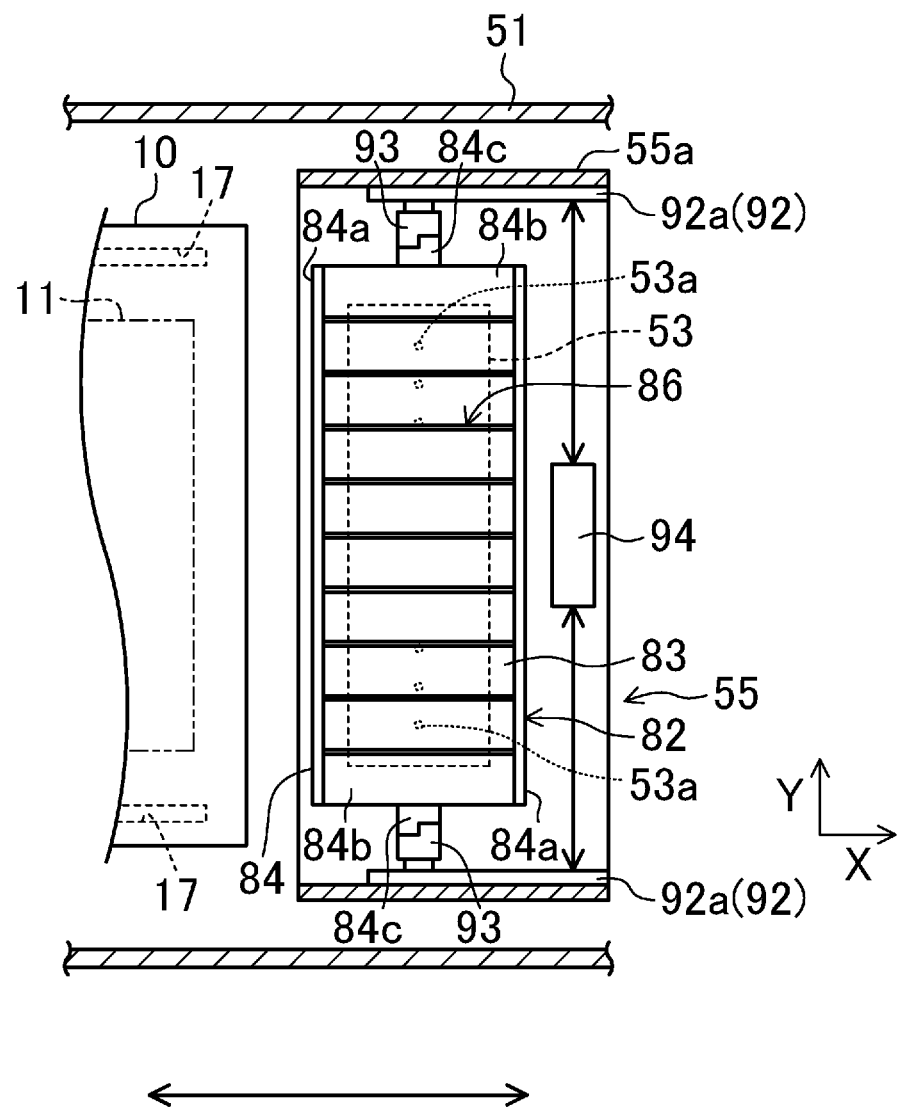
FIG. 11 is a schematic diagram corresponding to FIG. 9, in which a shadow mask shown in FIG. 9 is omitted.
Figure 12:
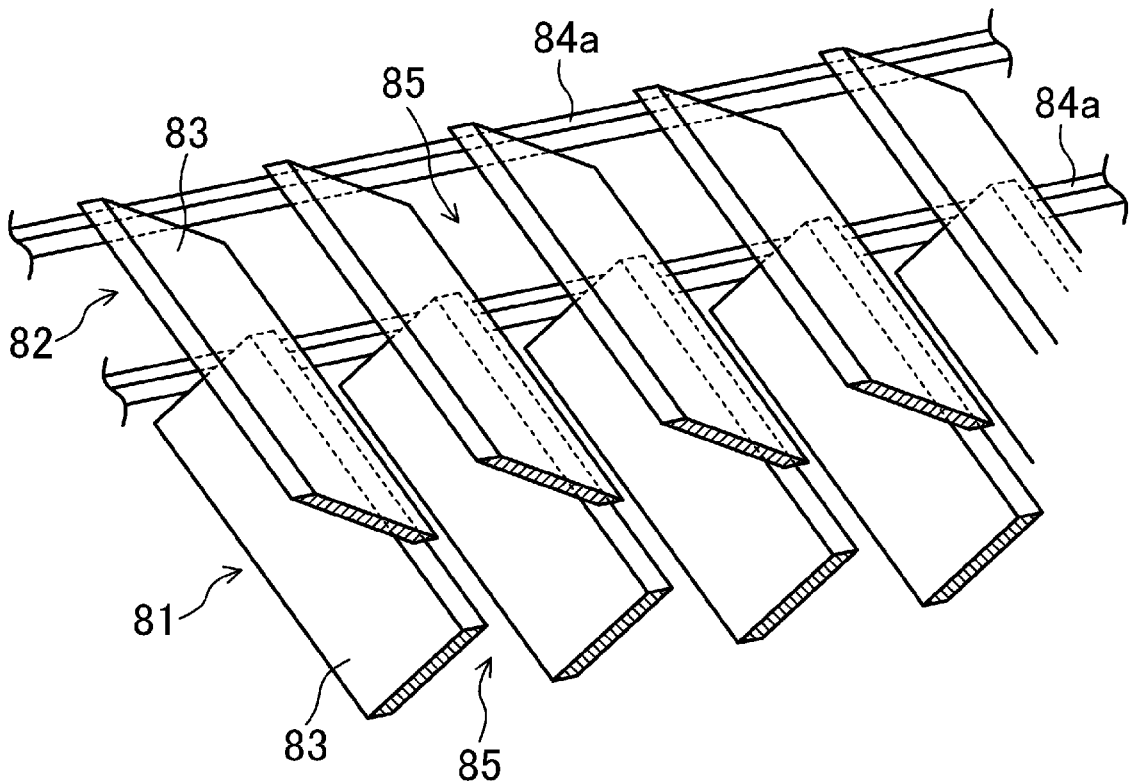
FIG. 12 is a schematic perspective view partially showing correction plates.

As shown in FIGS. 11 and 12 as well, each correction plate 81, 82 is in the shape of a rectangular plate corresponding to the shadow mask 60, and is formed by a plurality of blade plates 83, 83, . . . , a frame 84 that supports the blade plates 83, 83, . . . , etc.

The frame 84 has a pair of side frame portions 84a, 84a extending parallel to each other (longer sides) and a pair of end frame portions 84b, 84b connecting the ends of the side frame portions 84a, 84a (shorter sides). The plurality of blade plates 83 are arranged in a rectangular opening defined by the side frame portions 84a, 84a and the end frame portions 84b, 84b. The blade plates 83 are band plate-shaped members having the same dimensions, and have both longitudinal ends supported by the side frame portions 84a.

Each blade plate 83 is tilted with respect to the deposition mask. The blade plates 83 are arranged so that the tilted blade plates 83 extend parallel to each other with a constant gap between adjoining ones of the tilted blade plates 83 (this gap is also referred to as the "inter-blade-plate gap 85"). Each correction plate 81, 82 is placed in the mask unit 55 so that the direction in which the blade plates 83 extend matches the X-axis direction. The direction in which the blade plates 83 of the first correction plate 81 are tilted is opposite to that in which the blade plates 83 of the second correction plate 82 are tilted.

Specifically, the blade plates 83 of each correction plate 81, 82 are tilted at the same angle as viewed in the X-axis direction. The blade plates 83 of each correction plate 81, 82 are placed so that there is a constant opening between adjoining ones of the blade plates 83 as viewed in the Z-axis direction (this opening is also referred to as the "inter-blade-plate opening 86") (see FIG. 11). In other words, the upper end of one of two adjoining blade plates 83, 83 having the inter-blade-plate gap 85 therebetween is separated from the lower end of the other blade plate 83 by a predetermined constant dimension in the Y-axis direction.

In FIG. 10, the blade plates 83 of the first correction plate 81 have their lower ends shifted to the left relative to their upper ends, whereas the blade plates 83 of the second correction plate 82 have their lower ends shifted to the right relative to their upper ends. Thus, the inter-blade-plate gaps 85 in the first correction plate 81 extend obliquely upward to the right, and the inter-blade-plate gaps 85 in the second correction plate 82 extend obliquely upward to the left. The directions in which the blade plates 83 of the first and second correction plates 81, 82 are tilted may be reversed. Namely, the blade plates 83 of the first correction plate 81 may have their lower ends shifted to the right relative to their upper ends, and the blade plates 83 of the second correction plate 82 may have their lower ends shifted to the left relative to their upper ends.

The apparent emission angle of the deposition particles toward the shadow mask 60 is set by selecting arrangement of the blade plates 83, etc. for each of the correction plates 81, 82.

Figure 13:
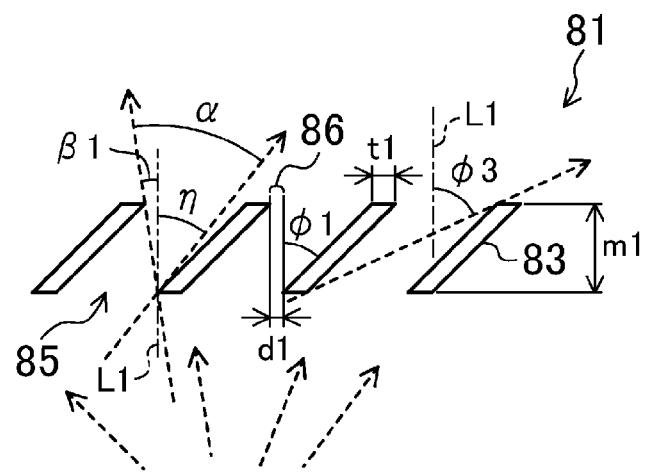
FIG. 13 is a schematic diagram partially showing blade plates in a first correction plate.

FIG. 13 schematically shows some of the blade plates 83 in the first correction plate 81. In the figure, broken arrows represent the tracks of the flying deposition particles. The deposition particles that can pass through the inter-blade-plate gaps 85 in the first correction plate 81 are limited to the deposition particles that pass through the range shown by an angle α.

That is, in FIG. 13, the deposition particles traveling obliquely upward to the left into the inter-blade-plate gaps 85 against the direction in which the blade plates 83 are tilted are limited by the blade plates 83. Accordingly, of the deposition particles traveling in this direction, only the deposition particles having a passing angle smaller than an angle β1 can pass through the inter-blade-plate gaps 85. The angle β1 is an angle between the deposition axis L1 and a line connecting the lower end of one of two adjoining blade plates 83, 83 having the inter-blade-plate gap 85 therebetween and the upper end of the other blade plate 83.

On the other hand, the deposition particles traveling obliquely upward to the right into the inter-blade-plate gaps 85 in the direction in which the blade plates 83 are tilted are hardly limited by the blade plates 83, and pass through the inter-blade-plate gaps 85. The deposition particles traveling in this direction are limited by the blade plates 83 if the maximum emission angle ψ is larger than an angle φ3 (η=φ). Otherwise, all of the deposition particles traveling in this direction can pass through the inter-blade-plate gaps 85 (η=ψ).

Thus, only those deposition particles traveling in the range of an angle α are allowed to pass through the first correction plate 81. The angle α is the sum of the angles β1 and η.

The relation "tan β1=d1/m1" is satisfied, where "d1" represents the width of the inter-blade-plate opening 86 in the first correction plate 81, and "m1" represents the height dimension of the blade plate 83 in the Z-axis direction. Thus, the angle β1 can be set as desired by selecting the width d1 of the inter-blade-plate opening 86 and the height dimension m1 of the blade plate 83.

The opening ratio of the first correction plate 81 is represented by "d1/(d1+m1×tan φ1+t1)," where "t1" represents the thickness dimension of the blade plate 83 in the Y-axis direction. If the angle β1 is set, the opening ratio is defined by a tilt angle φ1 and the thickness dimension t1. Thus, the opening ratio is improved by reducing the tilt angle φ1 and the thickness dimension t1. Accordingly, it is preferable that the tilt angle φ1 and the thickness dimension t1 be as small as possible.

Figure 14:
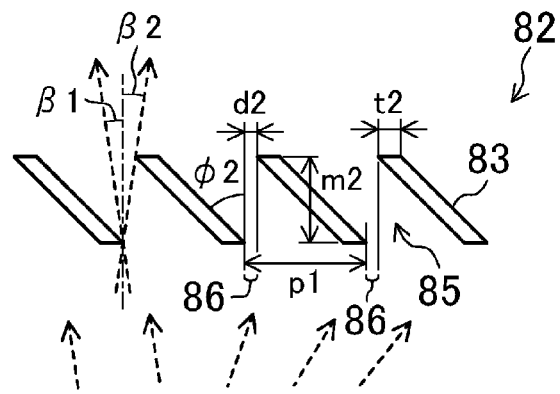
FIG. 14 is a schematic diagram partially showing blade plates in a second correction plate.

FIG. 14 schematically shows some of the blade plates 83 in the second correction plate 83. As in FIG. 13, broken arrows represent the tracks of the flying deposition particles. The deposition particles traveling obliquely upward to the left are limited by the first correction plate 81 to those traveling at an angle smaller than the angle β1. Thus, like the first correction plate 81, the second correction plate 82 limits the deposition particles traveling obliquely upward to the right to those traveling at an angle smaller than an angle β2. This further limits the deposition particles that can pass through the inter-blade-plate gaps 85 in the second correction plate 82.

Specifically, the relation "tan β2=d2/m2" is satisfied, where "d2" represents the width of the inter-blade-plate opening 86 in the second correction plate 82, and "m2" represents the height dimension of the blade plate 83 in the Z-axis direction. Thus, the angle β2 can be set by selecting the width d2 of the inter-blade-plate opening 86 and the height dimension m2 of the blade plate 83. In the second correction plate 82 as well, it is preferable that the tilt angle φ2 and the thickness dimension t2 be as small as possible in order to improve the opening ratio of the second correction plate 82.

Figure 15:
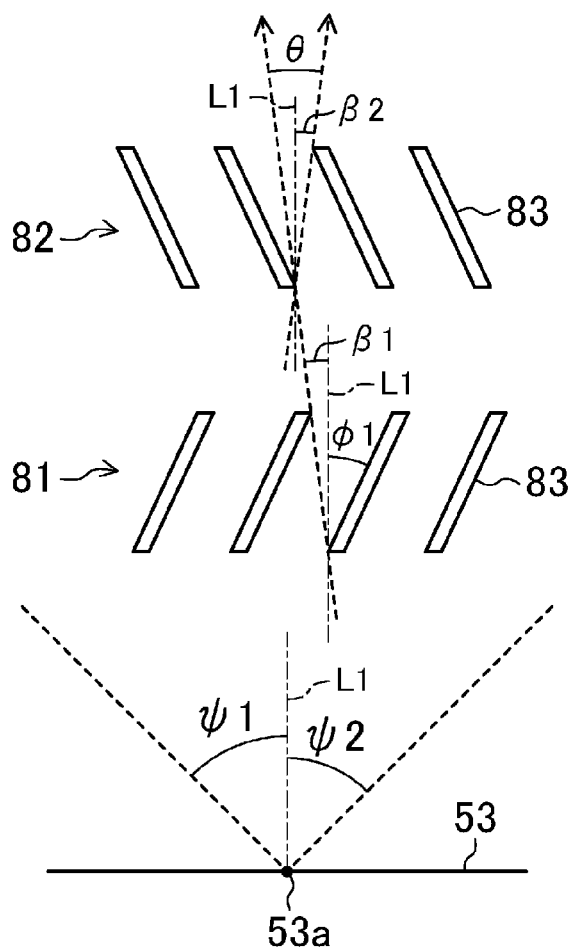
FIG. 15 is a schematic diagram partially showing a deposition source, the first correction plate, and the second correction plate.

As shown in FIG. 15, limiting the traveling direction of the deposition particles by the first correction plate 81 and the second correction plate 82 in this manner allows the traveling direction of the deposition particles toward the shadow mask 60 to be limited to a desired angle θ.

That is, in FIG. 15, the left emission angle ψ1 of the deposition particles emitted from the emission port 53a can be limited to β1 by the first correction plate 81 whose blade plates 83 are tilted in the direction against the direction in which these deposition particles are emitted. The right emission angle ψ2 of the deposition particles emitted from the emission port 53a can be limited to β2 by the second correction plate 82 whose blade plates 83 are tilted in the direction against the direction in which these deposition particles are emitted. β1 and β2 are normally set to the same value. Thus, the same correction plates can be used as the first correction plate 81 and the second correction plate 82.

Figure 16:
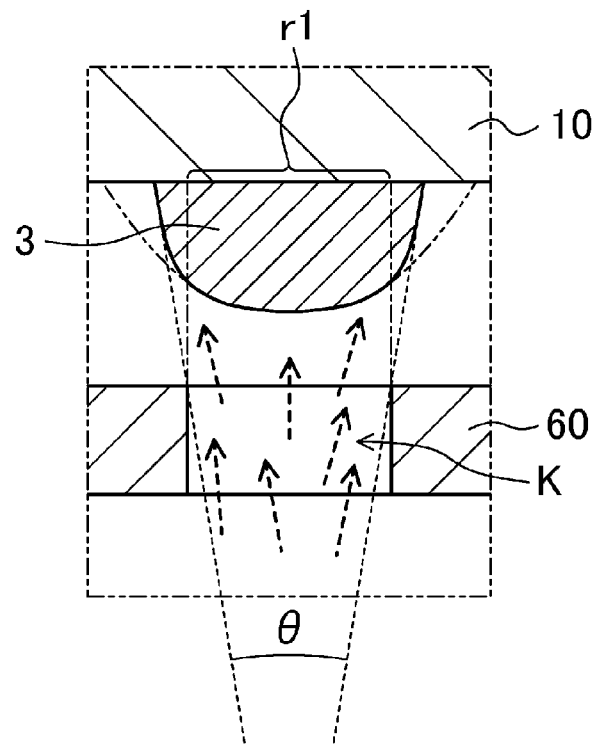
FIG. 16 is a schematic diagram illustrating reduction in undesirable deposition.

By apparently reducing the emission angle of the deposition particles directed onto the shadow mask 60 in this manner, the maximum incident angle can be reduced as shown in FIG. 16, whereby undesirable deposition can be effectively reduced.

Selecting the setting conditions of the correction plates 81, 82 allows the apparent emission angle to be adjusted as desired, and thus allows the amount of reduction in undesirable deposition to be adjusted as required. Moreover, since the angle β1 obtained by the first correction plate 81 may be different from the angle β2 obtained by the second correction plate 82, the width of undesirable deposition can be individually adjusted on both sides of the thin film 3.

Some of the emitted deposition particles (deposition material) adhere to the correction plates 81, 82. Thus, the longer the deposition apparatus is used, the more the deposition material is deposited on the correction plates 81, 82.

However, the blade plates 83 are tilted with respect to the shadow mask 60. Thus, the width of the inter-blade-plate opening 86 can be stably maintained even if the deposition particles adhere to the correction plates 81, 82 and are deposited thereon.

For example, if the blade plates 83 are placed parallel to the shadow mask 60 (φ1, φ2=90°) or perpendicularly to the shadow mask 60 (φ1, φ2=0°) without being tilted, the inter-blade-plate gaps 85 become the inter-blade-plate openings 86, and the inter-blade-plate openings 86 are clogged quickly. However, tilting the blade plates 85 can make the inter-blade-plate gaps 85 larger than the inter-blade-plate openings 86. Thus, the deposition apparatus can be used for a longer time.

Moreover, providing the correction plates 81, 82 can reduce the amount of deposition material that adheres to the shadow mask 60, and thus can reduce the frequency of replacement of the shadow mask 60. The utilization efficiency of the material can also be improved because undesirable deposition is reduced and the amount of unwanted deposition material adhering to the target substrate 10 is reduced.

The mask unit 55 includes, for each of the first correction plate 81 and the second correction plate 82, a slide apparatus 92 and support members 93 in order to support the first correction plate 81 and the second correction plate 82, and further includes a correction plate control apparatus 94 that controls the slide apparatus 92 and the support members 93. These components together with the correction plates 81, 82 contribute to reduction in undesirable deposition and improvement in utilization efficiency of the material.

The slide apparatus 92 has a pair of slide mechanisms 92a, 92a, and these slide mechanisms 92a, 92a are arranged on both sides of the holder 55a in the Y-axis direction so as to face each other. The support members 93 are rotatably supported on the opposing surfaces of the slide mechanisms 92a. The support members 93 can be slidingly displaced in the Z-axis direction and the X-axis direction in the state where the support members 93 face each other. The slide apparatus 92 operates together with the correction plate control apparatus 94 to control the movement of the support members 93.

The correction plate control apparatus 94 is a control apparatus electrically connected to the slide apparatus 92 and the support members 93. The correction plate control apparatus 94 is capable of accurately controlling the rotation and sliding displacement operation of the support members 93 in response to predetermined data that is applied to the correction plate control apparatus 94 via a predetermined input unit.

Each of the first correction plate 81 and the second correction plate 82 has a support portion 84c in a central portion of each end frame portion 84c in the lateral direction. The first correction plate 81 etc. is fixed to the holder 55a by attaching these support portions 84c, 84c to the support members 93. These support portions 84c, 84c can be detached from the support members 93, so that the first correction plate 81 etc. can be attached to and detached from the mask unit 55 as required.

Since the correction plates 81, 82 are detachable, the deposition material deposited thereon can be periodically collected.

For example, since the deposition material is melted or evaporated by heating, it can be easily collected by heating. The shadow mask 60 may be distorted by heating. Since high dimension accuracy is required for the shadow mask 60, such as the opening width and flatness, heat treatment cannot be performed on the shadow mask 60. However, since such high dimension accuracy is not required for the correction plates 81, 82, heat treatment can be performed on the correction plates 81, 82, and the deposition material deposited thereon can be easily collected. This can ensure high utilization efficiency of the material.

Each correction plate 81, 82 can be rotated by 180° and reversed by operating the correction plate control apparatus 94. In other words, each correction plate 81, 82 can be reversed so that the surfaces of the blade plates 83 which face the deposition source 53 face the shadow mask 60. That is, the correction plate control apparatus 94, the slide apparatus 92, and the support members 93 function as a reversing apparatus. Reversing the correction plate 81, 82 allows the other surface of the correction plate 81, 82 to be used if the correction plate 81, 82 has a large amount of deposition particles deposited on its one surface. This can reduce the frequency of replacement of the correction plates 81, 82. At this time, both the first correction plate 81 and the second correction plate 82 are reversed because the blade plates 83 of the first correction plate 81 and the second correction plate 82 are tilted in the opposite directions from each other.

In the present embodiment, the correction plates 81, 82 can be positioned in the Z-axis direction by operating the correction plate control apparatus 94. At this time, it is preferable to position the correction plates 81, 82 so that the deposition particles emitted through one inter-blade-plate gap 85 in the first correction plate 81 enter two or more of the inter-blade-plate openings 86 in the second correction plate 82.

Specifically, it is preferable to perform the positioning so that the deposition particles emitted through one inter-blade-plate gap 85 in the first correction plate 81 enter five or more of the inter-blade-plate openings 86 in the second correction plate 82. In this case, the positioning can be performed so as to satisfy the following first relational expression.

First relational expression: $G1 \times \tan \beta1/p1 \geq 5$

In the expression, "G1" represents the distance between the first correction plate 81 and the second correction plate 82 in the Z-axis direction (see FIG. 10), and "p1" represents the pitch of the inter-blade-plate openings 86 in the second correction plate 82 (see FIG. 14, $p1 = d2 + m2 \times \tan \phi2 + t2$).

This can prevent interference of the pitch of the inter-blade-plate openings 86 between the first correction plate 81 and the second correction plate 82, and can stabilize distribution of the deposition particles, whereby unexpected variation in distribution of the deposition particles and uneven distribution of the deposition particles can be suppressed.

Similarly, it is preferable to perform the positioning so that the deposition particles emitted through one inter-blade-plate gap 85 in the second correction plate 82 enter two or more of the openings K in the shadow mask 60. Specifically, it is preferable to perform the positioning so that the deposition particles emitted through one inter-blade-plate gap 85 in the second correction plate 82 enter five or more of the openings K in the shadow mask 60.

In this case, the positioning can be performed so as to satisfy the following second relational expression.

Second relational expression: $G2 \times \tan \beta2/p2 \geq 5$

In the expression, "G2" represents the distance between the second correction plate 82 and the shadow mask 60 in the Z-axis direction (see FIG. 10), and "p2" represents the pitch of the openings K in the shadow mask 60 (see FIG. 9).

This can prevent interference between the pitch of the inter-blade-plate openings 86 in the second correction plate 82 and the pitch of the openings K in the shadow mask 60, and can further stabilize distribution of the deposition particles, whereby unexpected variation in distribution of the deposition particles and uneven distribution of the deposition particles can further be suppressed.

By operating the correction plate control apparatus 94, each correction plate 81, 82 itself can be tilted, and can be supported in the tilted state. For example, tilting the correction plate 81, 82 itself allows the tilt of the blade plates 83 with respect to the shadow mask 60 to be finely adjusted while performing the deposition process. Thus, more practical, accurate reduction in undesirable deposition can be achieved.

In order to prevent the deposition particles emitted from the deposition source 53 from adhering to a portion where the deposition particles should not be deposited, the adhesion preventing plate 91 is provided inside each of the opposing surfaces of the slide mechanisms 92a so as to define both sides of the space that the blade plates 83 faces. The presence of the adhesion preventing plate 91 ensures that only the deposition particles that have passed through the correction plates 81, 82 reach the shadow mask 60.

The deposition apparatus 50 may be implemented in various forms other than the deposition apparatus 50 described above. For example, the deposition apparatus 50 may be configured so that the mask unit 55 is moved, rather than being configured so that the substrate 10 is moved. In this case, it is preferable that the blade plates 83 move together with the mask unit 55. The number of emission ports 53a and the arrangement thereof can be adjusted as appropriate. One or more emission ports 53a may be slit-shaped emission ports extending in the Y-axis direction. A plurality of emission ports 53a may be arranged in the X-axis direction.

Figure 17:
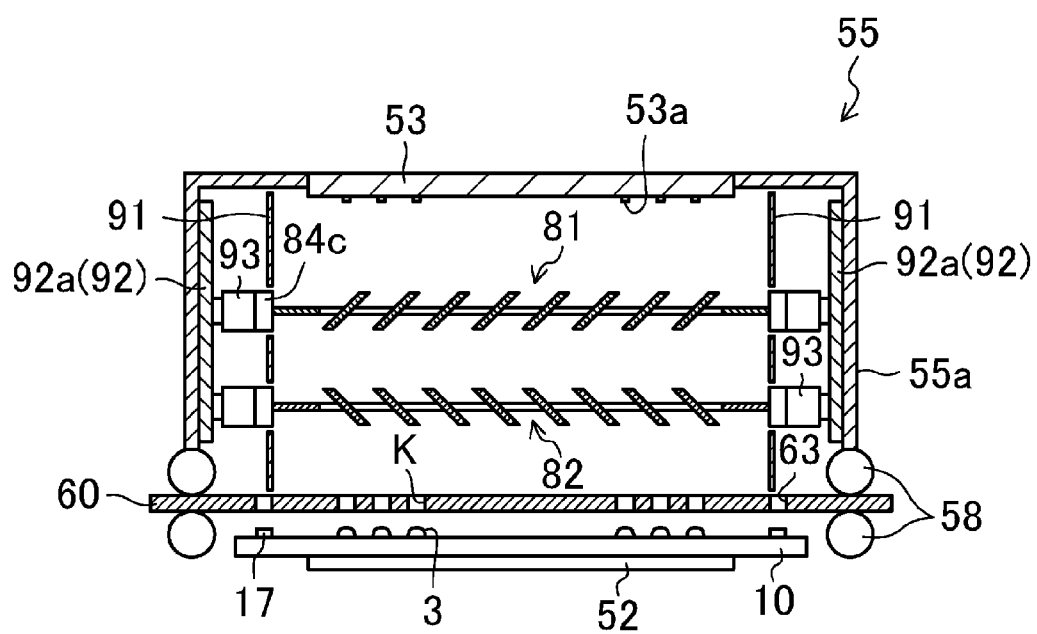
FIG. 17 is a schematic diagram showing a main part of a deposition apparatus in another form.

As shown in FIG. 17, the positions of the mask unit 55 and the substrate support apparatus 52 may be reversed in the vertical direction so that the deposition particles are emitted downward. Since the configuration and function of each member etc. are similar to those of the deposition apparatus 50 of the present embodiment, the same reference characters are used, and description thereof is omitted. This configuration is advantageous in that the target substrate 10 can be easily supported.

(Deposition Method)

Figure 18:
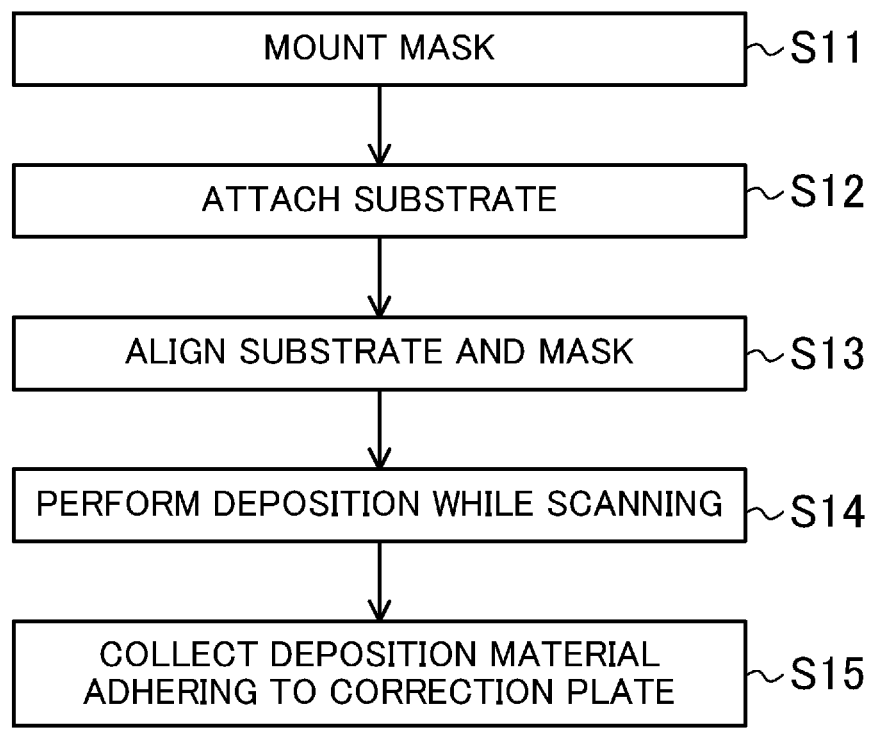
FIG. 18 is a flowchart showing a deposition process of a light-emitting layer.

FIG. 18 shows main steps of the deposition method. For example, the shadow mask 60 for the red (R) light-emitting layer 25R is mounted in the mask unit 55, and the shadow mask 60 is horizontally supported by the tension retaining apparatus 58 (step S11). Thus, the shadow mask 60 and the deposition source 53 are held in a fixed predetermined positional relation. The first correction plate 81 and the second correction plate 82 have been placed in advance at predetermined positions. A deposition material for the red (R) light-emitting layer 25R has been placed in the deposition source 53.

Next, the target substrate 10 is attached to and supported by the substrate support apparatus 52 so that the row direction of the target substrate 10 is parallel to the scanning direction (step S12). Then, the target substrate 10 and the shadow mask 60 are placed so as to face each other, and are aligned in the vertical direction (the Z-axis direction) so that the predetermined gap H is provided between the target substrate 10 and the shadow mask 60 (the alignment step, step S13).

After the target substrate 10 etc. is thus placed in the deposition apparatus 50, the deposition apparatus 50 is operated to perform deposition on the entire display region 11 of the target substrate 10 while scanning the target substrate 10 (the deposition step, step S14). In this deposition step, the target substrate 10 moves in the scanning direction at a constant scanning speed. The target substrate 10 has been accurately positioned in the horizontal direction with respect to the shadow mask 60 by the positioning mechanism.

During this step, the deposition particles are emitted from the deposition source 53, and then are adjusted to the predetermined apparent emission angle by the first correction plate 81 and the second correction plate 82. The deposition particles thus adjusted to the predetermined apparent emission angle are sequentially deposited on the target substrate 10 through the openings K of the shadow mask 60, whereby a thin film 3 is formed. The thickness of the thin film 3 can be controlled by, e.g., adjusting the scanning speed and the number of scanning times. After the deposition step, the thin film 3 (the red light-emitting layer 25R) having a stripe pattern is formed in the regions of the red (R) sub-pixels 2R, 2R, . . . on the target substrate 10.

Figure 19:
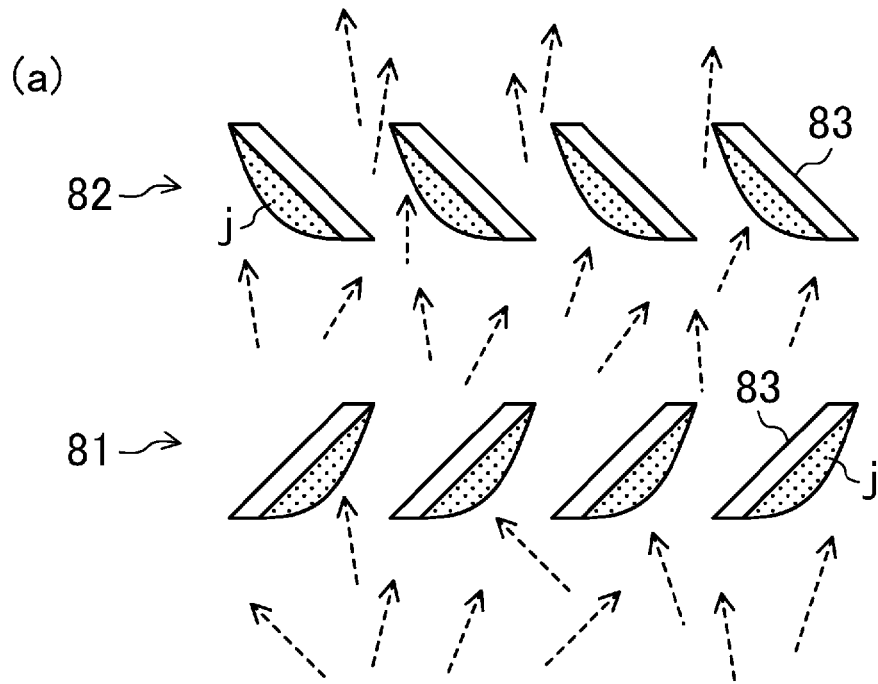
FIGS. 19A-19B are diagrams illustrating reversal of the correction plate.
Figure 19:
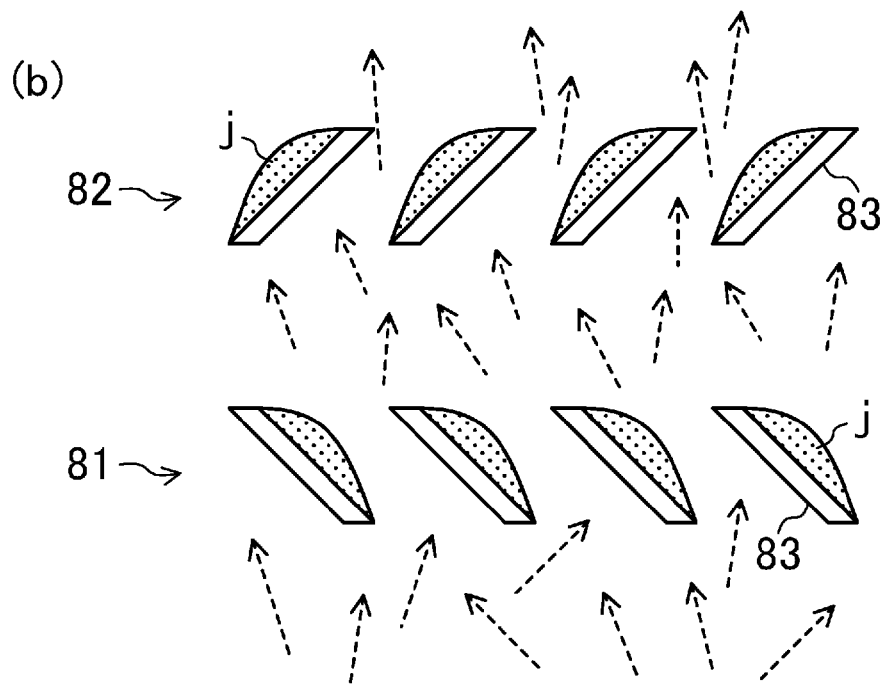

As shown in FIG. 19A, if the deposition process is continuously performed, the amount of deposition material deposited on the correction plates 81, 82 (shown by reference character "j" in the figure) is increased. In the deposition apparatus 50 of the present embodiment, as shown in FIG.

19B, the first correction plate 81 and the second correction rotation 82 are rotated by 180° and reversed if they have a large amount of deposition material j deposited thereon. This can reduce the frequency of replacement of the first correction plate 81 etc. by half. The angles β1, β2 are switched if the first correction plate 81 etc. is reversed.

If the first correction plate 81 etc. has a large amount of deposition material j deposited on both surfaces thereof, the correction plates 81, 82 are detached from the deposition apparatus 50 to collect the deposited deposition material j (the collection step, step S15).

For example, the deposition material can be easily collected by heating the detached correction plates 81, 82 under predetermined conditions to melt or sublimate the deposited deposition material j. After the deposition material j is collected, the correction plates 81, 82 can be attached back to the deposition apparatus 50, and the collected deposition material j can be placed back in the deposition source 53.

After the red (R) light-emitting layer 25R is formed, the green (G) and blue (B) light-emitting layers 25G, 25B can be formed by the same deposition method by changing the shadow mask 60 and the materials of the deposition source 53. In the case where the sub-pixels 2R, 2G, 2B of each color are arranged at the same pitch, the same shadow mask 60 can be used for the light-emitting layers 25R, 25G, 25B of the three colors by, e.g., shifting (moving) the shadow mask 60 by a predetermined pitch in the Y-axis direction.

(Modification)

Figure 20:
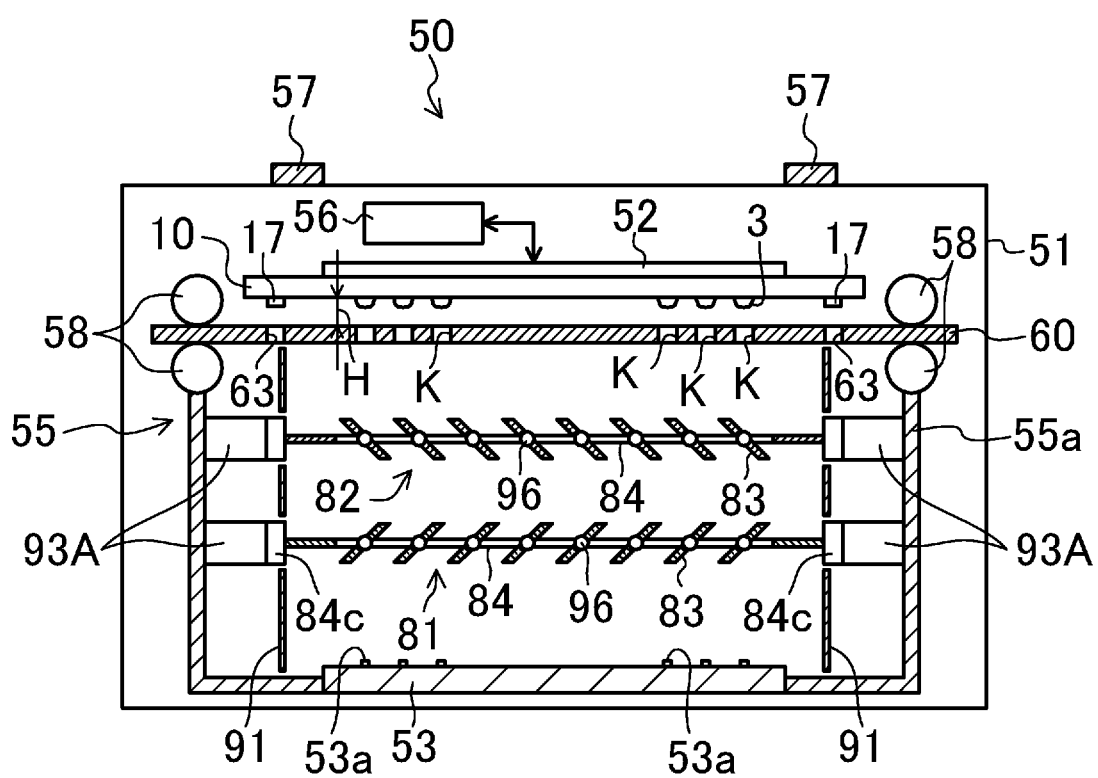
FIG. 20 is a diagram corresponding to FIG. 10 in a modification.
Figure 21:
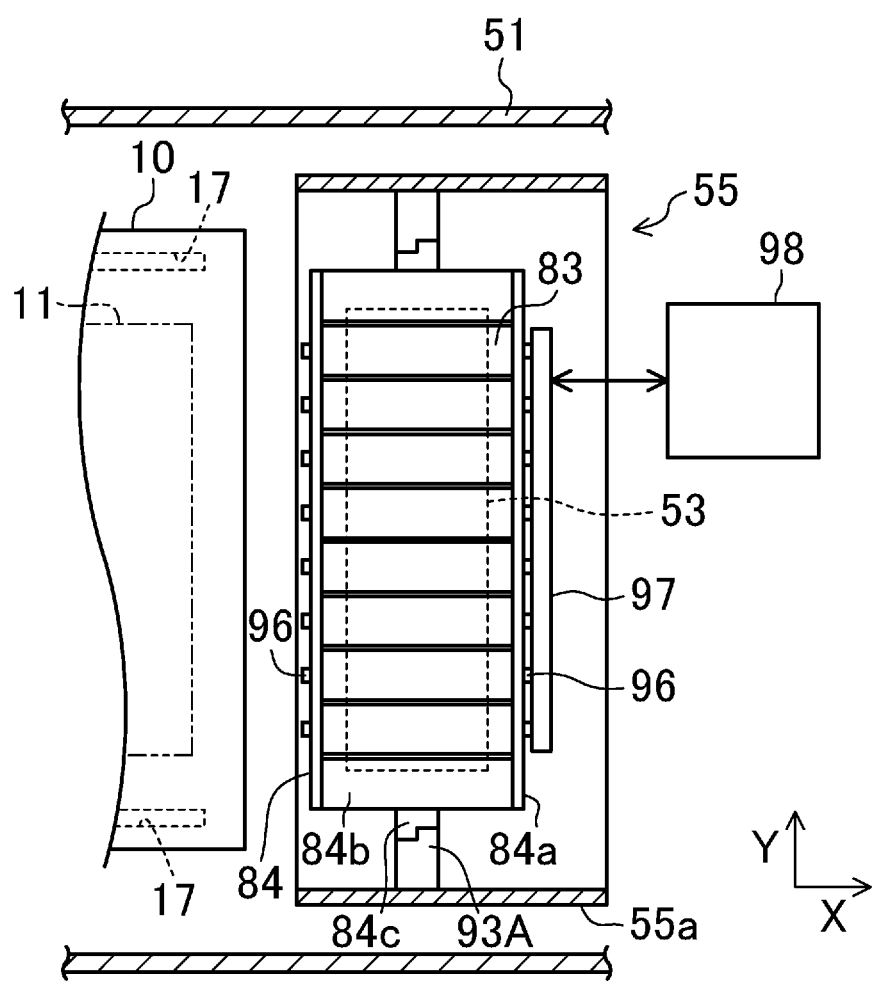
FIG. 21 is a diagram corresponding to FIG. 11 in a modification.

FIGS. 20-21 show a modification of the deposition apparatus 50 etc. of the embodiment. The deposition apparatus 50 of the modification is different from that of the embodiment particularly in that the deposition apparatus 50 of the modification does not include the slide apparatus 92, the support members 93, etc., and that the blade plates 83 are rotatably supported by the frame 84. In the following description, similar configurations are denoted by the same reference characters, and description thereof will be omitted. The differences between the embodiment and the modification will be described in detail.

In the modification, support members 93A are fixed to the holder 55a. The first correction plate 81 and the second correction plate 82 are detachably supported by the holder 55a via the support members 93A.

A rotating shaft 96 is provided at each longitudinal end of each blade plate 83 so as to be located in a center in a transverse sectional direction. The blade plates 83 are rotatably supported by the frame 84 via the rotating shafts 96. The frame 84 is provided with a rotating apparatus 97 that rotationally displaces the blade plates 83. A blade plate control apparatus 98 that controls the rotational angle, the rotation timing, etc. of the blade plates 83 is electrically connected to the rotating apparatus 97. The blade plate control apparatus 98 can synchronously control the amount of displacement of each blade plate 83. However, it is preferable that the blade plate control apparatus 98 be able to individually control the amount of displacement of each blade plate 83.

Thus, according to the deposition apparatus 50, since the tilt of each blade plate 83 in the first correction plate 81 and the second correction plate 82 can be adjusted as required, the apparent emission angle can be adjusted as desired. By merely changing the setting of the deposition apparatus 50, the same deposition apparatus 50 can be used for target substrates for which acceptable levels of undesirable deposition are different. This is advantageous in terms of versatility. In the case where the blade plate control apparatus 98 can individually control the amount of displacement of each blade plate 83, any variation in apparent emission angle, which is caused by variation in molding accuracy of the blade plates 83 or deposition of the deposition particles, can be suppressed by individually adjusting the amount of displacement of each blade plate 83.

In the deposition apparatus 50, since the blade plates 83 can be rotationally displaced to reverse the direction in which the blade plates 83 are tilted, the rotating apparatus 97 etc. functions substantially as a reversing apparatus.

If the length in the transverse sectional direction of the blade plates 83 is made larger than the pitch of the inter-blade-plate openings 86 in one of the correction plates 81, 82, this correction plate 81, 82 can function as a shutter.

That is, if the blade plates 83 are rotationally displaced so as to extend substantially parallel to the shadow mask 60, the inter-blade-plate openings 86 can be eliminated, whereby passage of the deposition particles can be completely blocked. This eliminates the need to separately provide a shutter, and thus can simplify the structure.

Passage of the deposition particles may be partially blocked during scanning of the target substrate 10. Namely, passage of the deposition particles may be blocked in a region where the thin film 3 is not to be formed. Accordingly, the deposition apparatus 50 is also advantageous in that the correction plate 81, 82 can also be used as a sophisticated shutter.

Example

The light-emitting layers 25R, 25G, 25B were formed by using the deposition apparatus 50 and the new deposition method described above.

A mask having a size of 200 mm (the X-axis direction)× 600 mm (the Y-axis direction) and having an overall thickness of 50 μm was used as the shadow mask 60. The shadow mask 60 was comprised of an invar material (a Ni—Fe alloy containing 36% of Ni). Each opening K had a width (the Y-axis direction) of 90 μm, and had a length (the X-axis direction) of 150 mm. The pitch of the openings K in the Y-axis direction was 450 μm. The number of openings K was 751. The frame 84 comprised of an invar material, etc. was placed on the outer periphery of the region where the openings K were provided in order to shield the region.

Both the first correction plate 81 and the second correction plate 82 had a size of 190 mm (the X-axis direction)×590 mm (the Y-axis direction). The blade plates 83 in the first and second correction plates 81, 82 had a height dimension (m1, m2) of 10 mm in the Z-axis direction and a thickness dimension (t1, t2) of 0.2 mm in the Y-axis direction. The blade plates 83 in the first and second correction plates 81, 82 had a tilt angle (φ1, φ2) of 10° with respect to the deposition axis L1 in the opposite directions. 129 inter-blade-plate openings 86 were formed in each of the first and second correction plates 81, 82, and the inter-blade-plate openings 86 had a width dimension (d1, d2) of 1 mm. Thus, the angles β1, β2 of the correction plates 81, 82 were about 5.7°.

The gap H between the target substrate 10 and the shadow mask 60 was 500 μm. The distance between the deposition source 53 and the first correction plate 81 was 30 mm, the distance (G2) between the shadow mask 60 and the second correction plate 82 was 50 mm, and the distance (G1) between the second correction plate 82 and the first correction plate 81 was 90 mm.

Each light-emitting region 16R, 16G, 16B had a size of 300 μm (the X-axis direction)×70 μm (the Y-axis direction), and the pitch of the light-emitting regions 16R, 16G, 16B was 450 μm in the X-axis direction and 150 μm in the Y-axis direction.

A host material and a dopant material were used as the materials of the light-emitting layers 25R, 25G, 25B of each color, and the deposition speeds of these materials were 5.0 nm/s and 0.53 nm/s for red (R), 5.0 nm/s and 0.67 nm/s for green (G), and 5.0 nm/s and 0.67 nm/s for blue (B). Scanning with one reciprocating motion was performed once in the deposition process. The maximum emission angle ($\psi 1$, $\psi 2$) of the deposition particles emitted through the emission port was about 60°.

As a result, the light-emitting layers 25R, 25G, 25B having a width of undesirable deposition of about 52 μm were able to be formed.

That is, as shown in FIG. 15, the traveling direction of the deposition particles emitted from the deposition source 53 is limited by the first correction plate 81 so that only the deposition particles traveling in the range of the angle $\beta 1$ of 5.7° and the angle $\phi 1$ (the tilt angle of the blade plates 83) of 10° with respect to the deposition axis L1 pass through the first correction plate 81. Then, the traveling direction of the deposition particles is further limited by the second correction plate 82 so that only the deposition particles traveling in the range of the angle $\beta 1$ of 5.7° and the angle $\beta 2$ of 5.7° with respect to the deposition axis L1 pass through the second correction plate 82.

As described above, in this example, the deposition particles emitted through the emission port and spreading in the range of the emission angle of 60° are apparently limited to the deposition particles having an emission angle of 5.7° when reaching the shadow mask 60. As a result, the incident angle of the deposition particles that are deposited on the target substrate 10 can be limited to 5.7° or less. Thus, the high-quality light-emitting layers 25R, 25G, 25B with reduced undesirable deposition were able to be formed.

As described above, according the present invention, undesirable deposition can be effectively reduced by a practical method, whereby even large-sized organic EL displays can be manufactured with high quality in a mass production process. Moreover, since reduction in undesirable deposition can be achieved, the organic EL displays can be designed to have larger light-emitting regions in the pixels. This can reduce current density and thus can suppress degradation in organic EL elements, whereby reliable organic EL displays having high emission lifetime characteristics can be implemented.

The deposition apparatus 50 etc. of the present invention is not limited to the above embodiment, and include various configurations other than those described above.

Although the deposition apparatus 50 has two deposition correction members in the above embodiment, the deposition apparatus 50 may have three or more deposition correction members. For example, each of the first correction plate 81 and the second correction plate 82 of the embodiment may be configured in two stages. In this case, the apparent emission angle can be limited to some degree by the first correction plate 81 etc. in the lower stage located on the side of the deposition source 53, and then can be finely adjusted by the first correction plate 81 etc. in the upper stage.

Either the entire deposition correction member or a part of the deposition correction member may be fixed to the mask unit 55. The blade plates 83 may be swingably supported by the frame 84. The slide apparatus need not necessarily be provided. The deposition correction members may be manually reversed.

DESCRIPTION OF REFERENCE CHARACTERS

3 Thin Film
10 Substrate
50 Deposition Apparatus
52 Substrate Support Apparatus
53 Deposition Source
53*a* Emission Port
55 Mask Unit
56 Moving Apparatus
60 Shadow Mask (Deposition Mask)
81 First Correction Plate (Deposition Correction Member)
82 Second Correction Plate (Deposition Correction Member)
83 Blade Plate
84 Frame
85 Inter-Blade-Plate Gap
86 Inter-Blade-Plate Opening (Opening)
92 Slide Apparatus
93 Support Member
94 Correction Plate Control Apparatus (Control Apparatus)
97 Rotating Apparatus
98 Blade Plate Control Apparatus (Control Apparatus)
K Opening in Deposition Mask

The invention claimed is:

1. A deposition apparatus that forms a thin film in a predetermined pattern on a substrate, comprising:

a deposition mask having a plurality of openings having a stripe pattern;

a deposition source that has an emission port on a side of the deposition mask, and that emits, through the emission port, deposition particles forming the thin film; and a first correction plate and a second correction plate placed between the deposition mask and the deposition source so that each of the first and second correction plates is separated from the deposition mask, the deposition source, and the other correction plate by a predetermined interval, the first correction plate being located on a side of the deposition source, and the second correction plate being located on the side of the deposition mask, a mask unit including the deposition mask, the deposition source, and the first and second correction plates, wherein a relative positional relation among the deposition mask, the deposition source, and the first and second correction plates being fixable; and a first actuator that electrically operates to relatively move at least one of the mask unit and the substrate along a predetermined scanning direction with a constant gap being provided between the substrate and the deposition mask, wherein each of the first and second correction plates has a plurality of blade plates each having a rectangular shape, the plurality of blade plates are arranged in rows substantially parallel to the deposition mask, and a frame that supports both longitudinal ends of the plurality of blade plates, each of the first and second correction plates is placed so that a longitudinal direction of the blade plates matches the scanning direction, each of the blade plates is arranged in the frame so as to be laterally tilted with respect to the deposition mask with a gap between adjoining ones of the plurality of blade plates, and the plurality of blade plates of the first correction plate are arranged so that one of the plurality of blade plates is not overlapped with another adjoining one of the blade plates as viewed in a direction orthogonal to the deposition mask, the plurality of blade plates of the second correction plate are arranged so that one of the plurality of blade plates is not overlapped with another adjoining one of the blade plates as viewed in the direction orthogonal to the deposition mask.

2. The deposition apparatus of claim 1, further comprising:
a substrate supporting carriage that supports the substrate, wherein
the deposition mask is placed so that a longitudinal direction of the openings matches the scanning direction, and
the blade plates of the first correction plate are tilted at a first tilt angle as viewed in the scanning direction, and the blade plates of the second correction plate are tilted at a second tilt angle, the first tilt angle and the second tilt angle being in opposite directions with respect to an axis orthogonal to the deposition mask.

3. The deposition apparatus of claim 2, further comprising:
a second actuator that electrically operates to reverse at least one of the first correction plate or the second correction plate.

4. The deposition apparatus of claim 2, further comprising:
a third actuator that electrically operates to slidingly displace at least one of the first correction plate or the second correction plate in the direction perpendicular to the deposition mask when deposition is not performed.

5. The deposition apparatus of claim 2, wherein
at least one of the first correction plate or the second correction plate is provided so as to be tiltable as viewed in the scanning direction, the deposition apparatus further comprising:
a controller that controls the first tilt angle or the second tilt angle.

6. The deposition apparatus of claim 2, wherein
the blade plates in at least one of the first correction plate or the second correction plate are rotatably supported by the frame through a rotating shaft provided at each of the ends of the blade plates, the deposition apparatus further comprising:
  a rolling mechanism that electrically operates to rotationally displace each of the rotatable blade plates; and
  a controller that operates with the rolling mechanism to adjust a tilt of the rotatable blade plates.

7. The deposition apparatus of claim 2, wherein
at least one of the first correction plate or the second correction plate is provided detachably.

8. A deposition method for forming a thin film in a stripe pattern on a substrate by depositing, through a plurality of openings formed in a deposition mask, deposition particles emitted from a deposition source, the method comprising:
using a deposition apparatus comprising:
  the deposition mask having the plurality of openings having a stripe pattern,
  the deposition source that has an emission port on a side of the deposition mask, and that emits, through the emission port, the deposition particles forming the thin film,
  a first correction plate and a second correction plate placed between the deposition mask and the deposition source so that each of the first and second correction plates is separated from the deposition mask, the deposition source, and the other correction plate by a predetermined interval, the first correction plate being located on a side of the deposition source, and the second correction plate being located on the side of the deposition mask, the first and second correction plates allowing only the deposition particles traveling in different predetermined directions to pass therethrough,
  a mask unit including the deposition mask, the deposition source, and the first and second correction plates, wherein a relative positional relation among the deposition mask, the deposition source, and the first and second correction plates being fixable, wherein
  each of the first and second correction plates has a plurality of blade plates each having a rectangular shape, the plurality of blade plates are arranged in rows substantially parallel to the deposition mask, and a frame that supports both longitudinal ends of the plurality of blade plates,
  each of the first and second correction plates is placed so that a longitudinal direction of the blade plates matches a predetermined scanning direction of the mask unit or the substrate, each of blade plates is arranged in the frame so as to be laterally tilted with respect to the deposition mask with a gap between adjoining ones of the plurality of blade plates, the plurality of blade plates of the first correction plate are arranged so that one of the plurality of blade plates is not overlapped with another adjoining one of the blade plates as viewed in a direction orthogonal to the deposition mask, the plurality of blade plates of the second correction plate are arranged so that one of the plurality of blade plates is not overlapped with another adjoining one of the blade plates as viewed in the direction orthogonal to the deposition mask;
  moving at least one of the mask unit and the substrate along the predetermined scanning direction with a constant gap being provided between the substrate and the deposition mask; and
  performing deposition while limiting a traveling direction of the deposition particles by the first and second correction plates.

9. The deposition method of claim 8, the method further comprising:
an alignment step of, with the substrate being supported by a substrate supporting carriage and with the constant gap being provided between the substrate and the deposition mask, aligning the mask unit and the substrate so that the mask unit faces the substrate; and
a deposition step of forming the thin film by sequentially depositing the deposition particles while relatively moving the at least one of the mask unit and the substrate along the predetermined scanning direction with the substrate supporting carriage.

10. The deposition method of claim 8, the method further comprising:
an alignment step of, with the substrate being supported by a substrate supporting carriage and with the constant gap being provided between the substrate and the deposition mask, aligning the mask unit and the substrate so that the mask unit faces the substrate;
a deposition step of forming the thin film by sequentially depositing the deposition particles while relatively moving the at least one of the mask unit and the substrate along the predetermined scanning direction with the substrate supporting carriage; and
a collection step of detaching the first and second correction plates from the deposition apparatus, and collecting the deposition particles adhering to the first and second correction plates.

11. The deposition apparatus of claim 1, wherein
the blade plates of each of the first and second correction plates are set so as to limit an angle of the deposition particles traveling to the deposition mask in a traveling direction.

12. The deposition apparatus of claim 2, wherein
the deposition apparatus is set to satisfy the following first relational expression:

First relational expression: $G1 \times \tan \beta1/p1 \geq 5$ where G1 represents a distance between the first correction plate and the second correction plate in a Z-axis direction orthogonal to the substrate, $\beta1$ represents a first angle of the deposition particles in a traveling direction passing through a lower end of a side portion of one of adjoining ones of the blade plates of the first correction plate having the gap therebetween and an upper end of a side portion of the other one of the blade plates with respect to the Z-axis direction, and p1 represents a pitch of the openings between adjoining ones of the blade plates of the second correction plate as viewed from the Z-axis direction.

13. The deposition apparatus of claim 2, wherein
the deposition apparatus is set to satisfy the following second relational expression:

Second relational expression: $G2 \times \tan \beta2/p2 \geq 5$ where G2 represents a distance between the second correction plate and the deposition mask in a Z-axis direction orthogonal to the substrate, $\beta2$ represents a second angle of the deposition particles in a traveling direction passing through a lower end of a side portion of one of adjoining ones of the blade plates of the second correction plate having the gap therebetween and an upper end of a side portion of the other one of the blade plates with respect to the Z-axis direction, and p2 represents a pitch of the openings of the deposition mask as viewed from the Z-axis direction.

14. The deposition apparatus of claim 12, wherein
the deposition apparatus is set to satisfy the following second relational expression:

Second relational expression: $G2 \times \tan \beta2/p2 \geq 5$ where G2 represents a distance between the second correction plate and the deposition mask in the Z-axis direction orthogonal to the substrate, $\beta2$ represents a second angle of the deposition particles in a traveling direction passing through a lower end of a side portion of one of adjoining ones of the blade plates of the second correction plate having the gap therebetween and an upper end of a side portion of the other one of the blade plates with respect to the Z-axis direction, and p2 represents a pitch of the openings of the deposition mask as viewed from the Z-axis direction.

* * * * *